(12) United States Patent
Kobayashi et al.

(10) Patent No.: US 7,518,691 B2
(45) Date of Patent: Apr. 14, 2009

(54) ELECTROOPTICAL DEVICE, MOUNTING STRUCTURE, AND ELECTRONIC APPARATUS HAVING WIRING FORMED ON AND PROTRUDING FROM A BASE MATERIAL TO DIRECTLY UNDER AN INPUT BUMP ON A SEMICONDUCTOR DEVICE

(75) Inventors: Shinichi Kobayashi, Nagano (JP); Atsunari Tsuda, Nagano (JP); Fusashi Kimura, Nagano (JP); Sakiko Miyagawa, Nagano (JP)

(73) Assignee: Seiko Epson Corporation (JP)

( * ) Notice: Subject to any disclaimer, the term of this patent is extended or adjusted under 35 U.S.C. 154(b) by 372 days.

(21) Appl. No.: 11/157,051

(22) Filed: Jun. 20, 2005

(65) Prior Publication Data

US 2006/0012745 A1 Jan. 19, 2006

(30) Foreign Application Priority Data

Jul. 13, 2004 (JP) ............................. 2004-205930

(51) Int. Cl.
*G02F 1/1345* (2006.01)
(52) U.S. Cl. ...................... 349/152; 349/149; 349/150; 349/151
(58) Field of Classification Search .................. 349/152
See application file for complete search history.

(56) References Cited

U.S. PATENT DOCUMENTS

| 4,906,071 | A | * | 3/1990 | Takahara et al. ............... 349/73 |
| 5,739,887 | A | * | 4/1998 | Ueda et al. ................... 349/149 |
| 5,893,623 | A | * | 4/1999 | Muramatsu ................. 349/152 |
| 5,914,763 | A | * | 6/1999 | Fujii et al. ................... 349/149 |
| 6,052,170 | A | * | 4/2000 | Kobayashi ................... 349/149 |
| 6,061,246 | A | * | 5/2000 | Oh et al. ...................... 361/749 |
| 6,281,959 | B1 | * | 8/2001 | Kim et al. ..................... 349/152 |
| 6,297,868 | B1 | * | 10/2001 | Takenaka et al. ............. 349/151 |
| 6,300,997 | B1 | * | 10/2001 | Saito et al. ................... 349/149 |
| 6,323,930 | B1 | * | 11/2001 | Higuchi et al. ............... 349/152 |
| 6,424,400 | B1 | * | 7/2002 | Kawasaki ..................... 349/149 |
| 6,583,844 | B1 | * | 6/2003 | Mishima et al. ............. 349/149 |
| 6,587,177 | B2 | * | 7/2003 | Kato .......................... 349/151 |
| 6,678,028 | B2 | * | 1/2004 | Yamate et al. ............... 349/151 |

(Continued)

FOREIGN PATENT DOCUMENTS

JP 04-242939 8/1992

(Continued)

*Primary Examiner*—Andrew Schechter
*Assistant Examiner*—Paisley L Arendt
(74) *Attorney, Agent, or Firm*—Harness, Dickey & Pierce P.L.C.

(57) ABSTRACT

An electrooptical device includes a substrate that holds an electrooptical substance, a first substrate line and a second substrate line provided on the substrate, a semiconductor device provided on the substrate, a first input bump and a second input bump provided on a surface of the semiconductor device, the surface being close to the substrate, an output bump provided on the surface of the semiconductor device to be connected to the first substrate line, a base material mounted on the substrate, a first line provided on the base material to be electrically connected to the first input bump, and a second line provided on the base material to be electrically connected to the second input bump via the second substrate line.

5 Claims, 22 Drawing Sheets

U.S. PATENT DOCUMENTS

| | | | |
|---|---|---|---|
| 6,680,773 B2 * | 1/2004 | Nakashima et al. | 349/151 |
| 6,683,669 B1 * | 1/2004 | Fujikawa | 349/149 |
| 6,760,091 B2 * | 7/2004 | Uehara | 349/152 |
| 6,819,387 B1 * | 11/2004 | Tamai | 349/149 |
| 6,917,104 B2 | 7/2005 | Hashimoto | |
| 2001/0012087 A1 * | 8/2001 | Sasuga et al. | 349/149 |
| 2003/0058376 A1 * | 3/2003 | Zhang | 349/43 |
| 2003/0058398 A1 * | 3/2003 | Yano | 349/149 |

FOREIGN PATENT DOCUMENTS

| | | |
|---|---|---|
| JP | 05-190600 | 7/1993 |
| JP | 05-218130 | 8/1993 |
| JP | 07-321152 | 3/1995 |
| JP | 09-033940 | 2/1997 |
| JP | 09-152621 | 6/1997 |
| JP | 09-305121 | 11/1997 |
| JP | 11-038434 | 2/1999 |
| JP | 2001-154601 | 6/2001 |
| JP | 2003-332386 | 11/2003 |

* cited by examiner

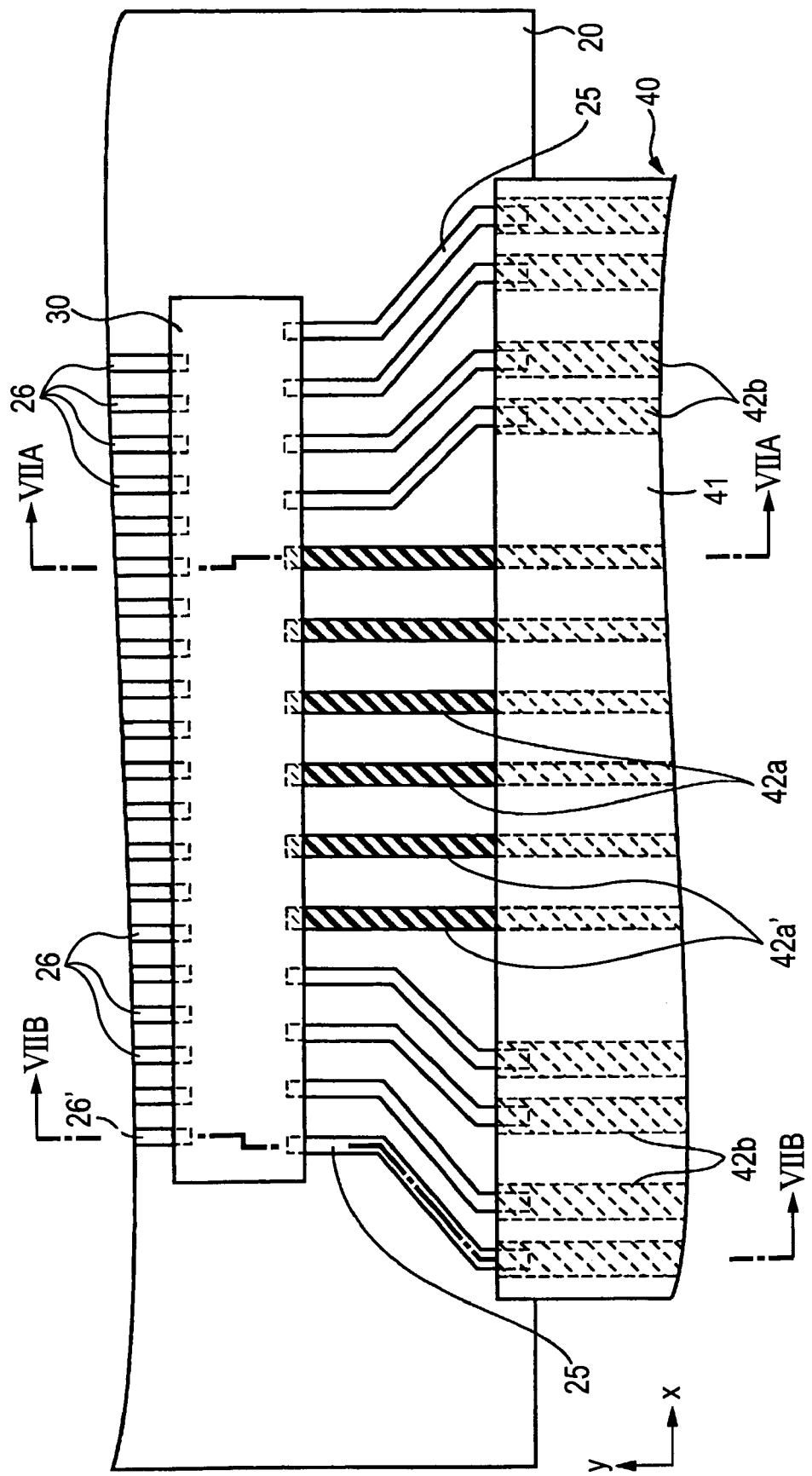

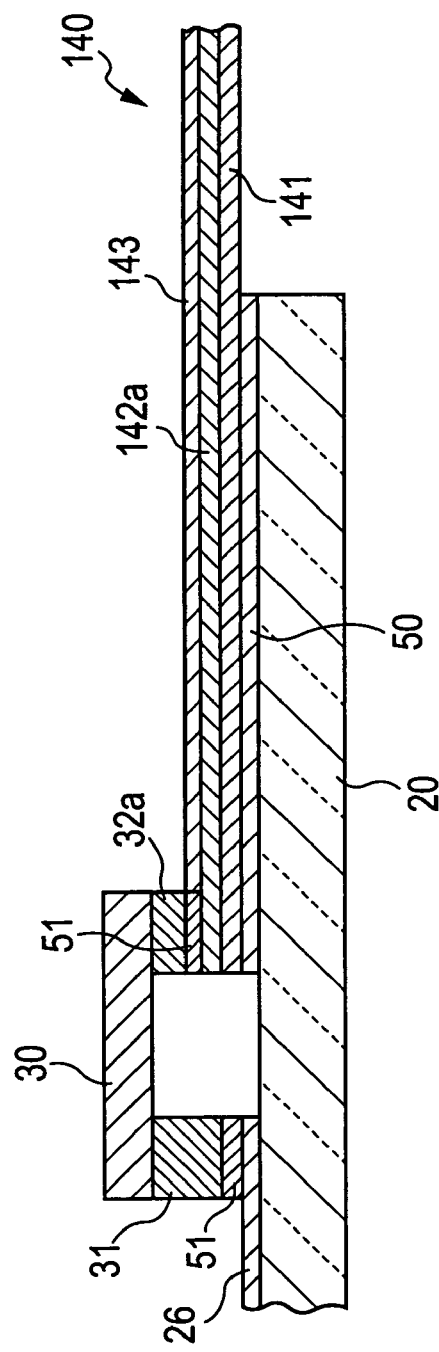
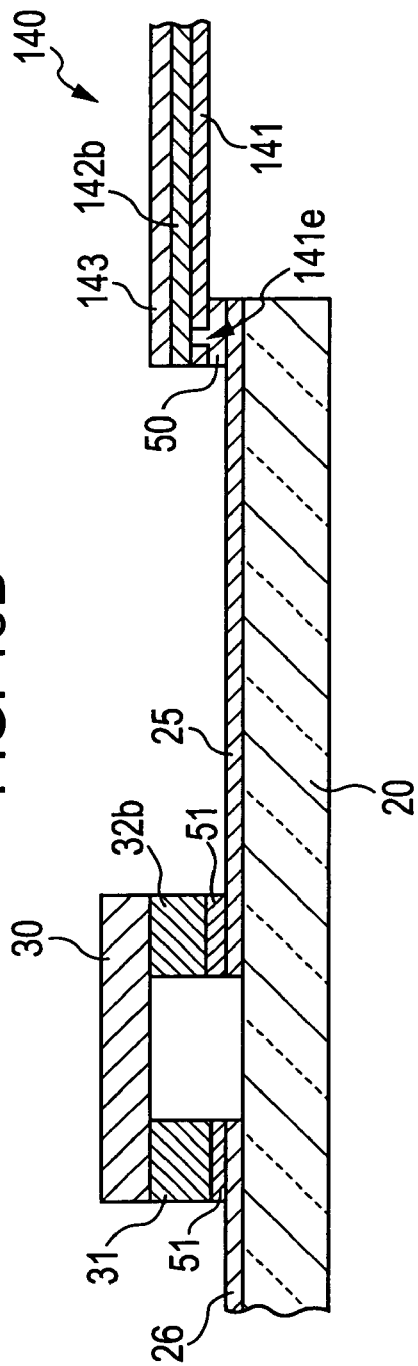

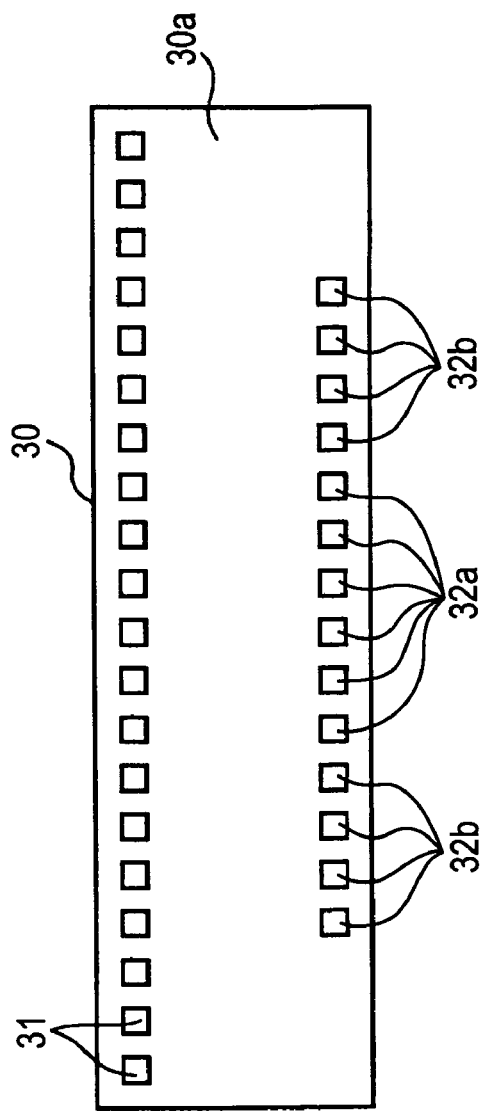
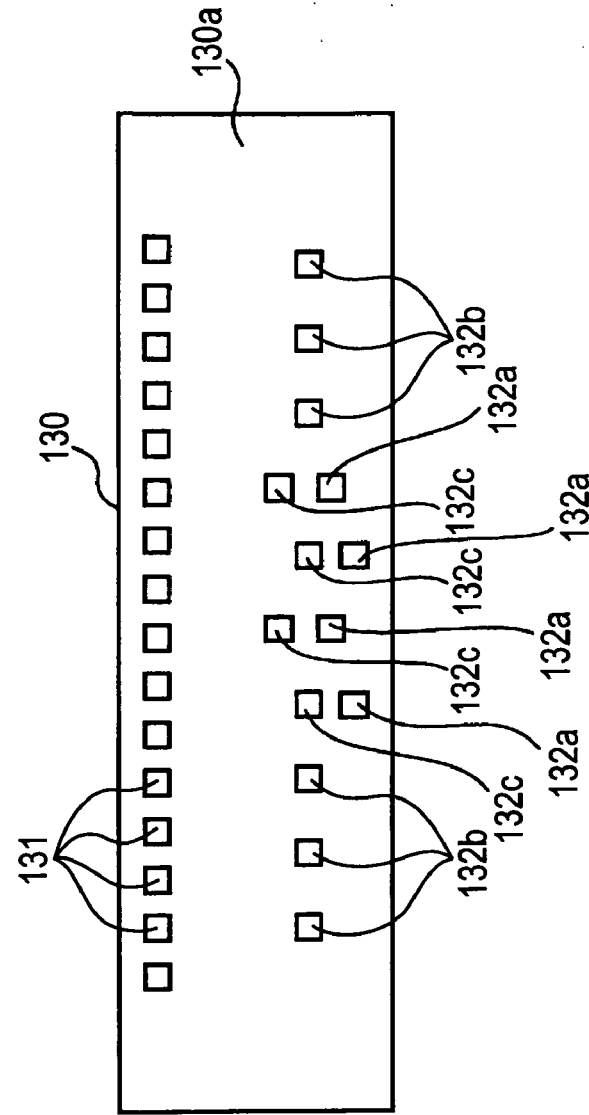
FIG. 20A
FIG. 20B

US 7,518,691 B2

ELECTROOPTICAL DEVICE, MOUNTING STRUCTURE, AND ELECTRONIC APPARATUS HAVING WIRING FORMED ON AND PROTRUDING FROM A BASE MATERIAL TO DIRECTLY UNDER AN INPUT BUMP ON A SEMICONDUCTOR DEVICE

RELATED APPLICATIONS

This application claims priority to Japanese Patent Application No. 2004-205930 filed Jul. 13, 2004 which is hereby expressly incorporated by reference herein in its entirety.

BACKGROUND OF THE INVENTION

1. Technical Field

The present invention relates to a mounting structure in which a semiconductor device mounted on a substrate is electrically connected to a circuit board, an electrooptical device having the mounting structure, and an electronic apparatus having the electrooptical device.

2. Related Art

An electrooptical device, for example, a COG (chip on glass) liquid crystal device includes a liquid crystal panel in which liquid crystal is sealed between a pair of substrates, a semiconductor device mounted on one of the substrates of the liquid crystal panel, a flexible printed circuit board electrically connected to the semiconductor device, and a circuit board that supplies signals to the liquid crystal panel via the flexible printed circuit board and the semiconductor device. Electrodes arranged in a display region, connecting lines for electrically connecting the electrodes to the semiconductor device, and input lines for electrically connecting the semiconductor device to the flexible printed circuit board are provided on the substrate of the liquid crystal panel. Signals are supplied from the circuit board to the electrodes via the flexible printed circuit board, the input lines, the semiconductor device, and the connecting lines, as disclosed in, for example, Japanese Unexamined Patent Application Publication No. 2001-154601 (paragraphs [0026] to [0028] and FIGS. 1 and 2).

In the above-described liquid crystal device, however, signals are input from the flexible printed circuit board to the electrodes via the input lines provided on the substrate. For this reason, the signals are attenuated by the wiring resistance of the input lines, and the display characteristics are degraded.

SUMMARY

An advantage of the invention is to provide a mounting structure in which a semiconductor device mounted on a substrate is connected to a circuit board while minimizing signal attenuation, an electrooptical device that minimizes signal attenuation and that provides superior display characteristics, and an electronic apparatus having the electrooptical device.

An electrooptical device according to a first aspect of the invention includes a substrate that holds an electrooptical substance, a first substrate line and a second substrate line provided on the substrate, a semiconductor device provided on the substrate, a first input bump and a second input bump provided on a first surface of the semiconductor device close to the substrate, an output bump provided on the first surface of the semiconductor device to be connected to the first substrate line, a base material mounted on the substrate, a first line provided on the base material to be electrically connected to the first input bump, and a second line provided on the base material to be electrically connected to the second input bump via the second substrate line.

In the electrooptical device, the first line provided on the base material is electrically connected to the first input bump without passing through the second substrate line on the substrate. Therefore, a signal input to the semiconductor device via the first input bump is not attenuated by the wiring resistance of the second substrate line. Since attenuation of image signals input to the electrooptical device is minimized, the electrooptical device has superior display characteristics. Furthermore, the impedance due to the second line does not need to be considered for the signals input via the first line. Therefore, impedance matching in the entire circuit can be performed easily and reliably. One (first line) of the lines on the base material is substantially directly and electrically connected to the first input bump, and the other line (second line) is electrically connected to the second input bump via the second substrate line on the substrate. This minimizes signal attenuation, improves the display characteristics, and reduces the size of the electrooptical device. In general, the pitch between the bumps of the semiconductor device is shorter than the pitch between the lines of the base material. For this reason, for example, in order to electrically connect all the lines of the base material to the bumps of the semiconductor device not via the substrate lines on the substrate, in a manner similar to that of the first line in this aspect, the pitch between the bumps needs to be long, and this increases the size of the semiconductor device. Consequently, the size of the liquid crystal device increases. In contrast, in the first aspect of the invention, only one (first line) of the lines on the base material is electrically connected to the first input bump without passing through the second substrate line on the substrate, and the other line (second line) is electrically connected to the second input bump via the second substrate line, as in the related art. For example, when the second substrate line electrically connected to the second line is patterned in a bent form in plan view, the lines on the base material and the input bumps on the semiconductor device can be electrically connected without increasing the size of the semiconductor device even when the pitch between the input bumps is short. For example, when a high-speed signal, which is easily attenuated by the wiring resistance of the second substrate line on the substrate, is input to the first line, it is not affected by the wiring resistance, and therefore, is input to the semiconductor device with little attenuation. Furthermore, when a low-speed signal, which is rarely attenuated by the wiring resistance, is input to the second line, the area in which the second substrate line electrically connected to the second line is provided can be reduced, for example, by patterning the second substrate line in a bent form. Consequently, the size of the electrooptical device decreases. Therefore, it is possible to minimize attenuation of signals input via the lines provided on the base material, to improve the display characteristics, and to reduce the size of the electrooptical device. The second substrate line includes a ground line.

It is preferable that the first line have a protruding portion protruding from the base material, and be electrically connected at the protruding portion to the first input bump. The first line may protrude from the base material in this way.

It is preferable that the base material have an overlapping portion that overlaps with the substrate, and that the first line be provided on a first side of the overlapping portion remote from the substrate, and be electrically connected to the first input bump on the overlapping portion.

In this case, since the first line is provided on the base material without protruding therefrom, it is more highly resistant to bending and breaking than when protruding from the base material. Therefore, the display characteristics of the electrooptical device can be prevented from being degraded by breaking of the first line.

It is preferable that the second line be provided on a second side of the overlapping portion close to the substrate.

In this case, the first line and the second line are provided on both sides of the base material, respectively. Therefore, more lines can be provided on the base material of the same size than when the lines are provided on one side. This reduces the total size of the substrate.

It is preferable that a high-speed signal be input to the first line.

In this case, since attenuation of an input high-speed signal is minimized, the display characteristics of the electrooptical device are improved. For example, when a high-speed signal is input to the semiconductor device via the second substrate line, it may be attenuated by the wiring resistance of the second substrate line, and this may degrade the display characteristics of the electrooptical device. In contrast, when the first line, to which a high-speed signal is input, is electrically connected to the input bump of the semiconductor device without passing through the second substrate line on the substrate, signal attenuation is minimized, and the display characteristics are improved. Herein, a high-speed signal refers to a signal having a high frequency of 50 MHz or more, for example, a small-amplitude actuating signal. Although it is preferable that only a high-speed signal be input to the first line, all the lines provided on the base material may be connected to the semiconductor device without passing through the second substrate line, if possible. In particular, when lines are provided on both sides of the base material, the size of the base material can be reduced, and therefore, all the lines can be suitably connected without passing through the second substrate line.

It is preferable that the height of the first input bump be smaller than the height of the second input bump.

In this case, electrical connection failure between the input bump and the line, and display failure are prevented. A connecting structure in a region in which the first line is electrically connected to the first input bump is different from that in a region in which the second substrate line electrically connected to the second line is connected to the second input bump. That is, the second substrate line is not provided in the region in which the first line and the first input bump are connected, while it is provided in the region in which the second substrate line and the second input bump are connected. Therefore, it is preferable that the heights of the first input bump and the second input bumps be adjusted in order to place the semiconductor device so that the substrate-side surface of the semiconductor device is substantially parallel to the surface of the substrate. For example, it is conceivable to make the first input bump and the second input bump have the same height, and to provide a thickness-adjusting layer on the substrate corresponding to the second input bump. In this case, however, a step of forming the thickness-adjusting layer is added, and production efficiency is thereby decreased. It is also conceivable to make the first input bump and the second input bump have the same height, and to place the semiconductor device with pressure so that the substrate-side surface of the semiconductor device and the surface of substrate are substantially parallel to each other when the input bumps are connected to the first line and the second line with a conductive adhesive. In this case, however, connection failure sometimes occurs between the second input bump and the second substrate line. In contrast, when the first input bump and the second input bump having different heights are provided in consideration of the difference in the line connecting structure therebetween, the production efficiency is increased, and display failure due to connection failure is prevented in the electrooptical device.

It is preferable that the first line be linear at least on the substrate.

In this case, the wiring resistance of the first line itself can be minimized, and a high-speed signal can be input to the semiconductor device while further reducing attenuation.

It is preferable that a ground signal be input to the second line.

In this way, a ground signal may be input to the second line. For example, it is effective for impedance matching to place the second line, to which the ground signal is input, on the substrate side of the base material.

It is preferable that the base material have a main portion, and a protruding portion protruding from the main portion, and that the first line be provided in the protruding portion.

In this way, the base material may have a protruding portion, and the first line may be provided in the protruding portion. For example, another line may be provided outside the protruding portion to be electrically connected to the second input bump via the second substrate line. In this case, the base material is provided in the region in which the first line and the first input bump are electrically connected, and is not provided in the region in which the second substrate line electrically connected to the line outside the protruding portion is connected to the second input bump. Since the first input bump and the second input bump are thus connected to the lines on the base material by different connecting structures, it is preferable to adjust the height of the first input bump electrically connected to the first line and the height of the second input bump in order to place the semiconductor device so that the substrate-side surface of the semiconductor device is substantially parallel to the surface of the substrate. The area in which the base material overlaps with the semiconductor device can be reduced by placing another line outside the protruding portion of the base material and by connecting the line to the second input bump via the second substrate line. Consequently, the number of bumps that should be adjusted in height, such as the first input bump electrically connected to the first line, is reduced, and adjustment is made easily.

An electrooptical device according to a second aspect of the invention includes a substrate that holds an electrooptical substance, a substrate line provided on the substrate, a semiconductor device provided on the substrate, an input bump provided on a substrate-side surface of the semiconductor device close to the substrate, an output bump provided on the substrate-side surface of the semiconductor device to be connected to the substrate line, a base material mounted on the substrate, and a line provided on the base material to be electrically connected to the input bump. The base material has an overlapping portion that overlaps with the substrate, and the line is provided on a side of the overlapping portion remote from the substrate, and is connected to the input bump on the overlapping portion.

In this case, since the line on the base material is electrically connected to the input bump without passing through the substrate line on the substrate, a signal input to the semiconductor device via the input bump is not attenuated by the wiring resistance of the substrate line. Attenuation of image signals input to the electrooptical device is minimized, and therefore, the display characteristics of the electrooptical device are improved. Furthermore, impedance matching of the entire circuit can be easily and reliably performed because there is no need to consider the impedance due to the substrate line for the signals input via the line. Moreover, since the line is provided on the base material without protruding outside, it is more highly resistant to bending and breaking than when it protrudes from the base material. This prevents the display characteristics of the electrooptical device from being degraded by breaking of the line.

A mounting structure according to a third aspect of the invention includes a substrate, a substrate line provided on the substrate, a semiconductor device provided on the substrate, an input bump provided on a substrate-side surface of the semiconductor device close to the substrate, an output bump provided on the substrate-side surface of the semiconductor device to be connected to the substrate line, a base material mounted on the substrate, and a line provided on the base material to be electrically connected to the input bump. The base material has an overlapping portion that overlaps with the substrate, and the line is provided on a side of the overlapping portion remote from the substrate, and is connected to the input bump on the overlapping portion.

In this case, since the line on the base material is electrically connected to the input bump without passing through the substrate line on the substrate, a signal input to the semiconductor device via the input bump is not attenuated by the wiring resistance of the substrate line. Furthermore, impedance matching of the entire circuit can be easily and reliably performed because there is no need to consider the impedance due to the substrate line for the signals input via the line. Moreover, since the line is provided on the base material without protruding outside, it is more highly resistant to bending and breaking than when it protrudes from the base material. Consequently, the supply of signals is rarely stopped by the breaking of the line.

An electronic apparatus according to a fourth aspect of the invention includes any of the above-described electrooptical devices. The electronic apparatus having the electrooptical device has a display screen of high quality.

BRIEF DESCRIPTION OF THE DRAWINGS

The invention will be described with reference to the accompanying drawings, wherein like numbers reference like elements, and wherein:

FIG. 6 is a plan view of the liquid crystal device corresponding to FIG. 5;

FIGS. 13A and 13B are partial sectional views of the liquid crystal device, respectively, taken along line XIIIA and XIIIB in FIG. 12;

FIGS. 20A and 20B are schematic plan views of a mounting surface of a driving IC;

DESCRIPTION OF THE EMBODIMENTS

Figure 1:
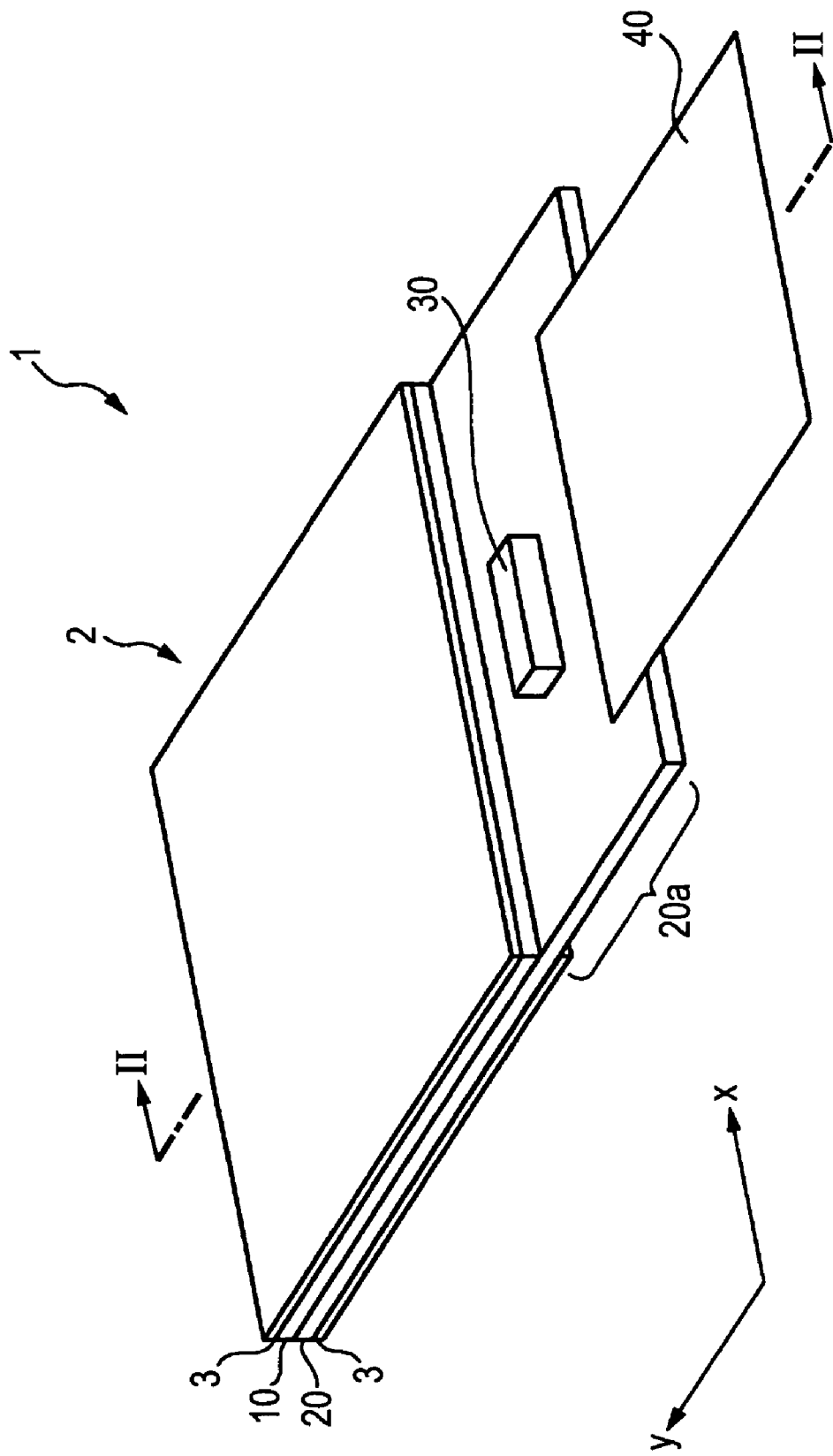
FIG. 1 is a schematic perspective view of a liquid crystal device according to a first embodiment of the invention.

Embodiments of the invention will be described below with reference to the drawings. In the following, a liquid crystal device will be described as an example of an electrooptical device. More specifically, the liquid crystal device is an active-matrix COG liquid crystal device utilizing TFTs (thin film transistors). However, the invention is not limited to such a liquid crystal device. In order to easily understand components, structures, scales, and number of the components in the drawings are made different from those of actual components.

First Embodiment

Configuration of Electrooptical Device

Figure 2:
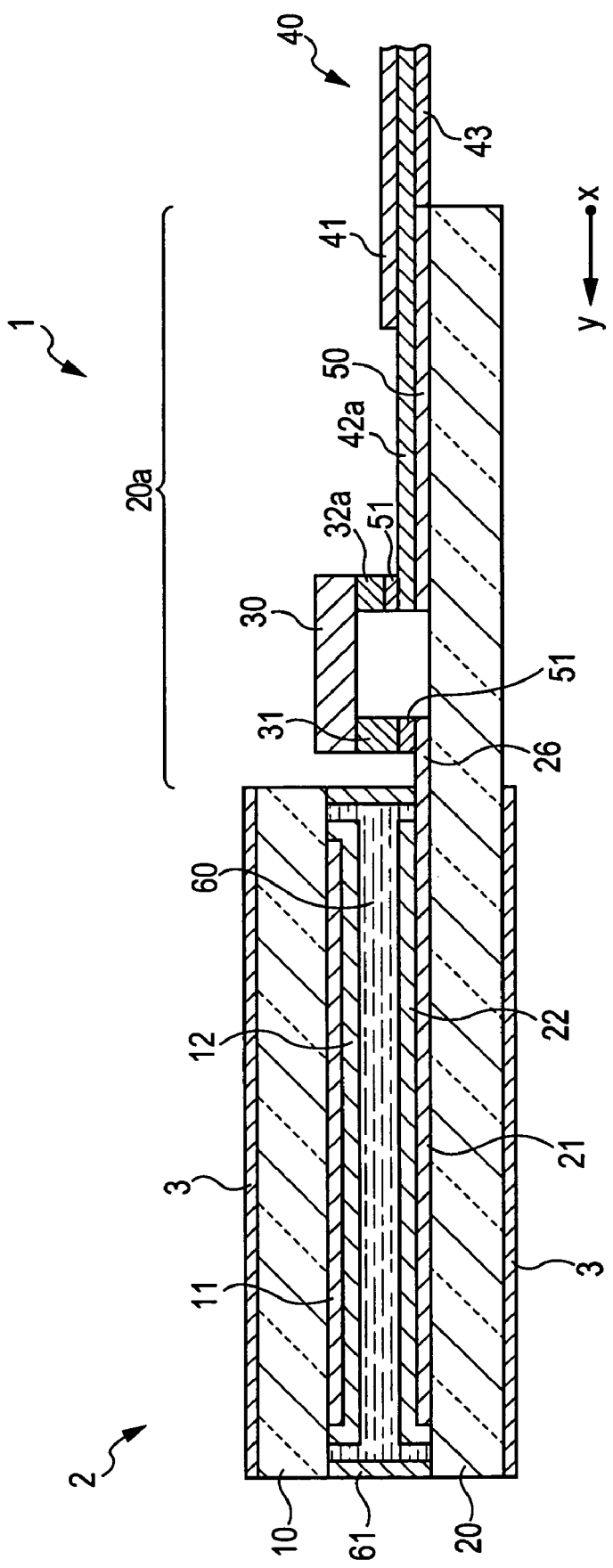
FIG. 2 is a schematic sectional view of the liquid crystal device, taken along line II-II in FIG. 1.
Figure 3:
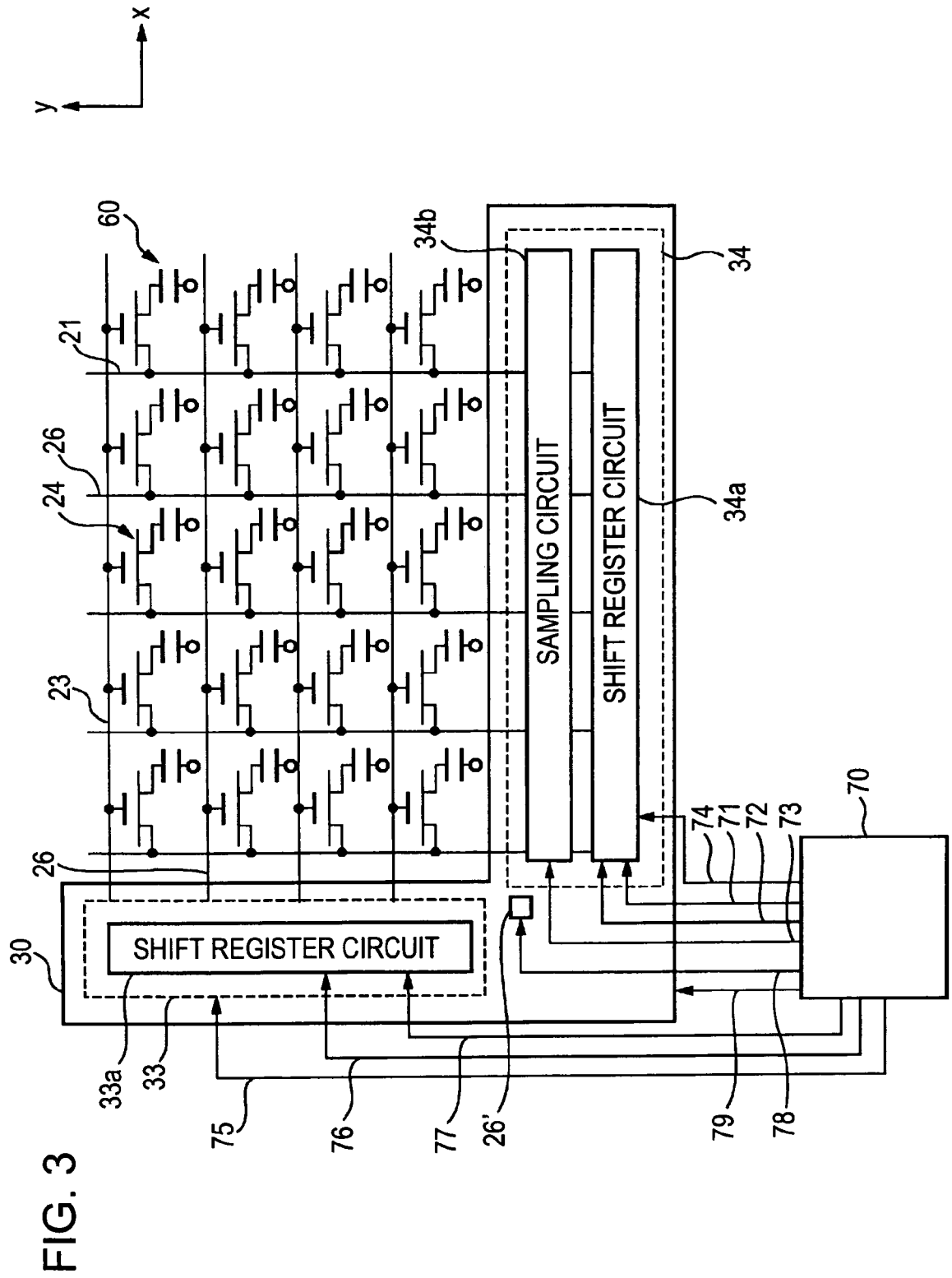
FIG. 3 is a schematic circuit diagram of the liquid crystal device.

FIG. 1 is a schematic perspective view of a liquid crystal device serving as an electrooptical device according to a first embodiment of the invention. FIG. 2 is a cross-sectional view of the liquid crystal device, taken along line II-II in FIG. 1. FIG. 3 is a schematic plan view showing, for example, lines provided on an array substrate and peripheral circuits in the liquid crystal device.

Referring to FIGS. 1 and 2, a liquid crystal device 1 of the first embodiment includes a liquid crystal panel 2 serving as an electrooptical panel, a pair of polarizers 3 between which the liquid crystal panel 2 is sandwiched, a flexible printed circuit board 40 electrically connected to the liquid crystal panel 2, a driving IC 30 serving as a semiconductor device mounted on the liquid crystal panel 2, and a circuit board (reference numeral 70 in FIG. 3) connected to the flexible printed circuit board 40.

The liquid crystal panel 2 includes a counter substrate 10 and an array substrate 20 formed of a pair of insulating substrates made of, for example, glass and bonded together-with a sealing material 61. An electrooptical substance 60, such as 90-degree TN (twisted nematic) liquid crystal, is held in a region-surrounded by the substrates 10 and 20 and the sealing material 61.

The counter substrate 10 includes a counter electrode 11 made of a solid transparent ITO (indium tin oxide) film, and an alignment film 12 covering the counter electrode 11. The counter electrode 11 is electrically connected to a connecting line 26' (which will be described later) provided on the array substrate 20.

As shown in FIGS. 2 and 3, the array substrate 20 includes a plurality of scanning lines 23 extending in the X-direction, a plurality of data lines 21 extending in the Y-direction, pixel electrodes (not shown) provided at the intersections of the scanning lines 23 and the data lines 21, and TFTS 24 serving as switching elements that switch between a conductive state and a nonconductive state between the data lines 21 and the pixel electrodes according to scanning signals input to the scanning lines 23. An alignment film 22 covers the data lines 21, the TFTs 24, and the pixel electrodes.

The array substrate 20 has an extended portion 20a protruding from the counter substrate 10, as shown in FIGS. 1 and 2. The extended portion 20a is provided with the driving IC 30 serving as a semiconductor device, connecting lines 26 serving as first substrate lines extended from the data lines 21 and the scanning lines 23, a connecting line 26' serving as a first substrate line electrically connected to the counter electrode 11, and input lines 25 (which will be described later) serving as second substrate lines electrically connected to second lines 42b of the flexible printed circuit board 40. A structure for connecting the driving IC 30, the array substrate 20, and the flexible printed circuit board 40 on the extended portion 20a will be described in detail later in the following description of the configuration of a mounting structure.

As shown in FIG. 3, the driving IC 30 includes a scanning-line driving circuit 33 and a data-line driving circuit 34. Although not shown, the flexible printed circuit board 40 is provided between the circuit board 70 and the driving IC 30 to make an electrical connection therebetween.

The scanning-line driving circuit 33 has a shift register circuit 33a, and receives power (negative power and positive power) 75, a start signal 76, and a clock signal (a reference clock signal and an inverted clock signal) 77 from the circuit board 70 having an external control circuit. While using the negative power and the positive power supplied from the circuit board 70 as a power source, the scanning-line driving circuit 33 starts the shift register circuit 33a in response to the input of a start signal 76, and line-sequentially applies scanning signals to the scanning lines 23 via the connecting lines 26 in the form of pulses at predetermined timings based on clock signals 77 supplied from the circuit board 70.

The data-line driving circuit 34 includes, for example, a shift register circuit 34a and a sampling circuit 34b. The data-line driving circuit 34 receives power (negative power and positive power) 74, a start signal 71, a clock signal (a reference clock signal and an inverted clock signal) 72, and an image signal 73 from the circuit board 70. When image signals 73 corresponding to a display image are supplied from the circuit board 70, the sampling circuit 34b samples only voltages of the corresponding data lines 21. While using the negative power and the positive power supplied from the circuit board 70 as a power source, the data-line driving circuit 34 starts the shift register circuit 34a in response to the input of a start signal 71. In accordance with the timings at which the scanning-line driving circuit 33 applies scanning signals in response to clock signals 77 supplied from the circuit board 70, image signals sampled by the sampling circuit 34b are supplied to the data lines 21 via the connecting lines 26.

As shown in FIG. 3, a common voltage 78 is supplied from the circuit board 70 to the connecting line 26' electrically connected to the counter electrode 11. A ground signal 79 is supplied from the circuit board 70 to the driving IC 30.

In the above-described configuration, each TFT 24 gate-connected to the corresponding scanning line 23 is placed in a conductive state in response to the supply of a scanning signal, and an image signal is supplied to the corresponding pixel electrode via the TFT 24, thereby performing image display at the pixel.

With an increase in resolution of display images, image signals having quite high frequencies have been input. For example, the dot frequencies of image signals in an XGA display mode and an SXGA display mode are approximately 65 MHz and approximately 135 MHz, and these frequencies are much higher than the dot frequency (approximately 30 MHz) in a VGA display mode. Correspondingly, in particular, the frequency of a data-line reference clock signal 72 supplied to the data-line driving circuit 34 has become high. The start signal 71 supplied to the data-line driving circuit 34, and the start signal 76 and the clock signal 77 supplied to the scanning-line driving circuit 33 are low-speed signals having a low frequency. In contrast, the data-line reference clock signal 72 is a high-speed signal having a high frequency. Although not described, an enable signal that limits the width of pulses sequentially output from the shift register circuit 34a is also a high-speed signal having a period shorter than the horizontal scanning period.

Structure of Printed Circuit Board

Figure 4:
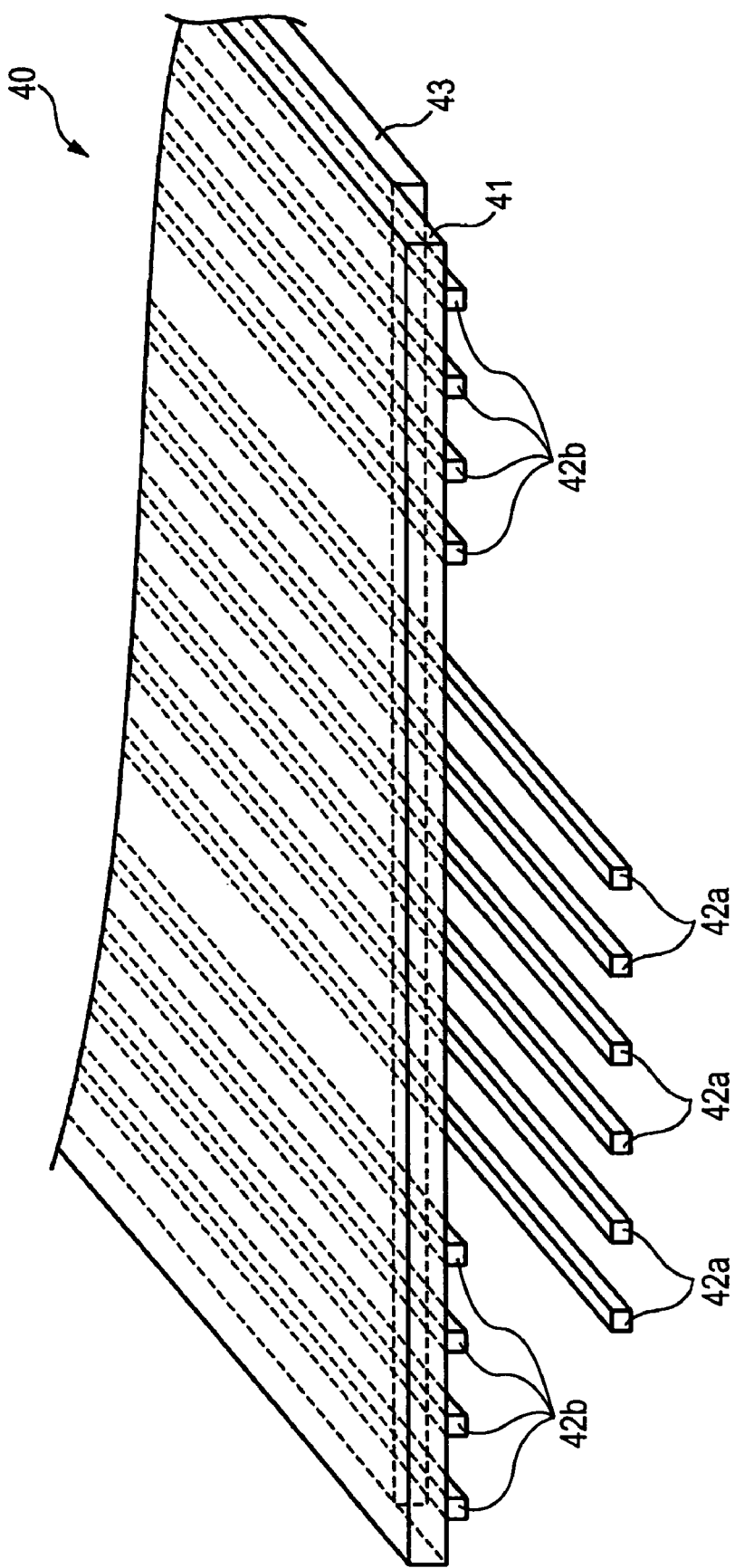
FIG. 4 is a partly enlarged schematic perspective view of a flexible printed circuit board in the liquid crystal device.

The above-described flexible printed circuit board 40 will now be described. FIG. 4 is a partly enlarged perspective view of the flexible printed circuit board 40 shown in FIG. 1.

As shown in FIG. 4, the flexible printed circuit board 40 includes a base material 41 made of a flexible material such as polyimide, a plurality of (six in the embodiment) first lines 42a and a plurality of (eight in the embodiment) second lines 42b provided on one surface of the base material 41, and a protective layer 43 made of, for example, polyimide, acryl, or epoxy and provided on the base material 41 to partly cover the first lines 42a and the second lines 42b. The first and second lines 42a and 42b are approximately 20 μm in thickness, and the base material 41 is approximately 25 μm in thickness. The first lines 42a and 42b are made of Cu (copper), and are arranged parallel to each other. Four second lines 42b are provided on each side of six first lines 42a. The first lines 42a are longer than the second lines 42b, and longer portions thereof linearly protrude as protruding portions 42a' from the base material 41. Portions of the first lines 42a including the protruding portions 42a' are not covered with the protective layer 43. Portions of the second lines 42b are connected to input lines which will be described later, and the other portions are almost covered with the protective layer 43. The flexible printed circuit board 40 is foldable.

Configuration of Mounting Structure

A mounting structure constituted by the array substrate 20, the driving IC 30 mounted thereon, and the flexible printed circuit board 40 electrically connected to the driving IC 30 will now be described with reference to FIGS. 2, 5 to 7, and 20A. The mounting structure defines a part of the liquid crystal device 1.

Figure 5:
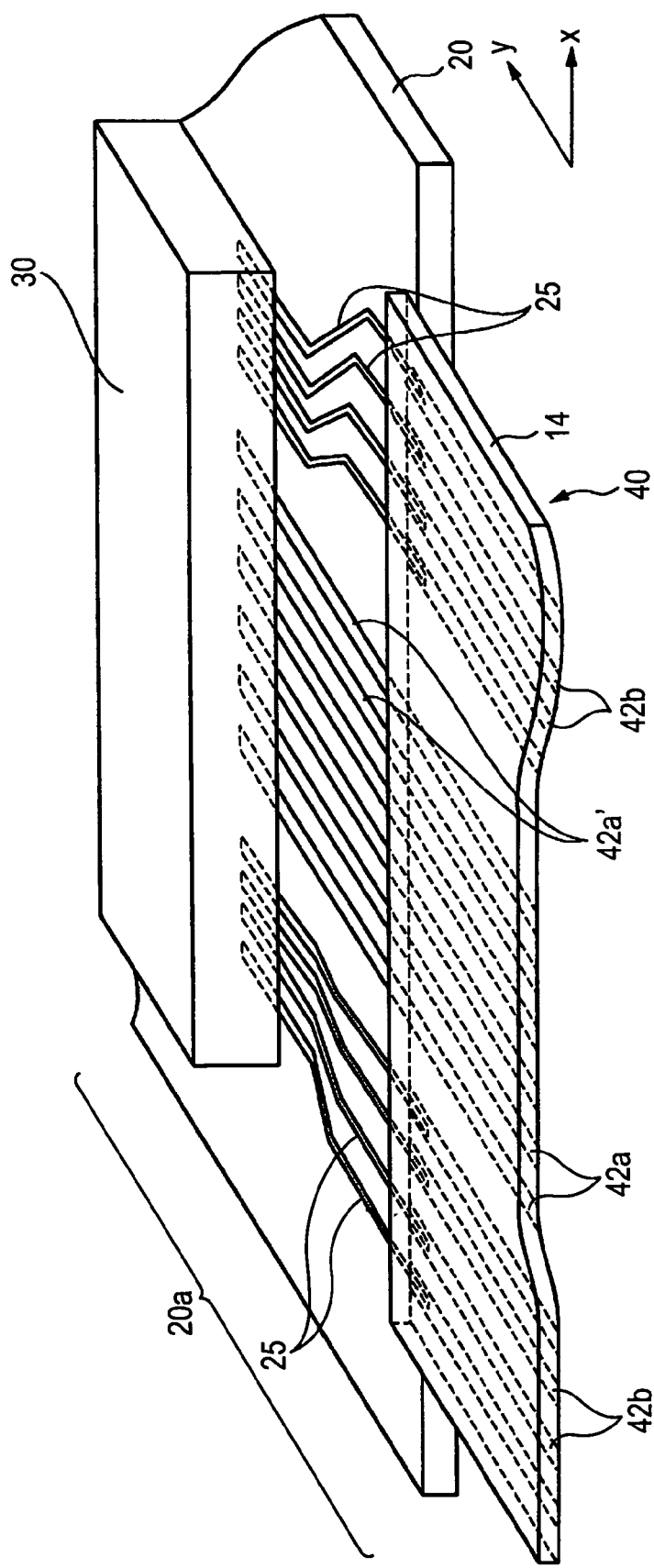
FIG. 5 is a schematic partial perspective view of the liquid crystal device.
Figure 7A:
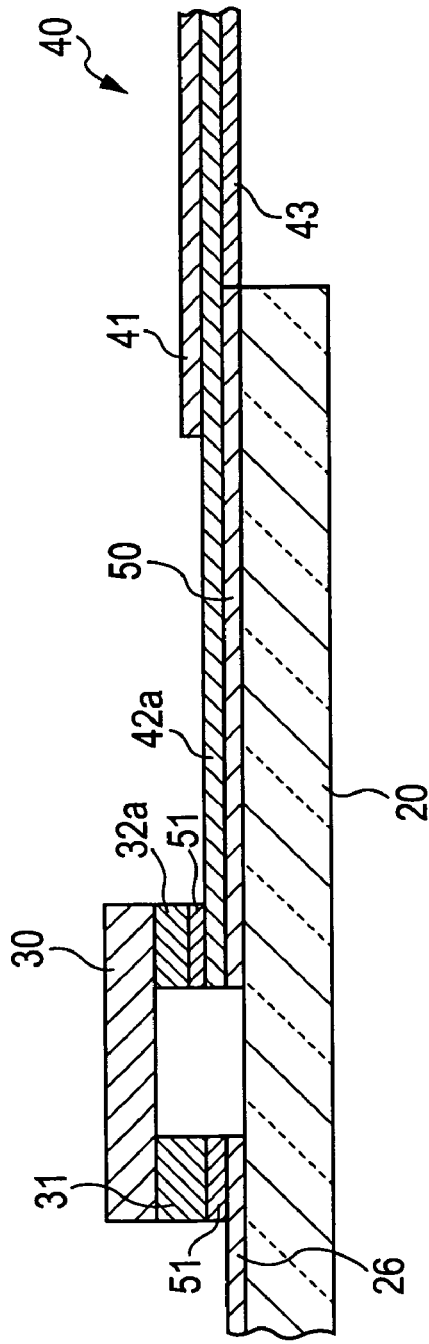
FIGS. 7A and 7B are partial sectional views of the liquid crystal device, respectively, taken along line VIIA and VIIB in FIG. 6.
Figure 7B:
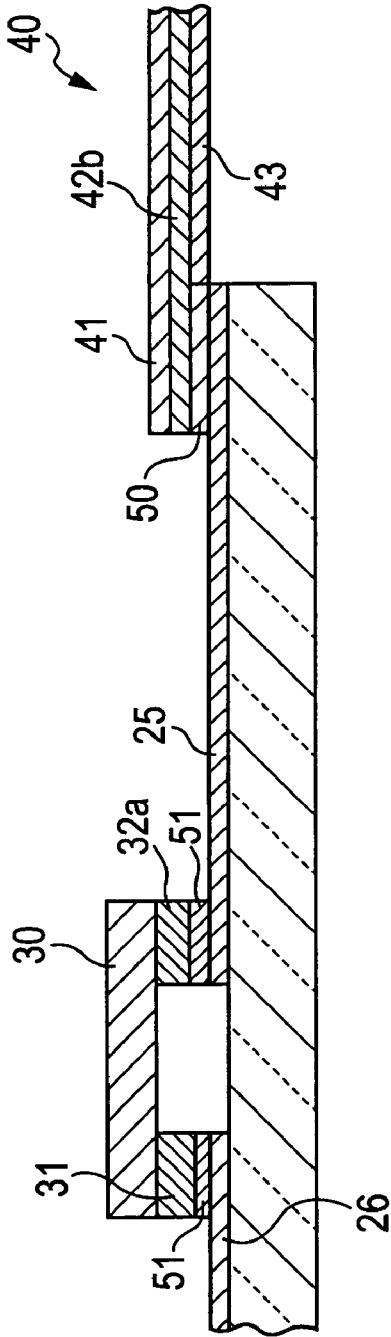

The structure of the extended portion 20a in the liquid crystal device 1 shown in FIG. 2 corresponds to a structure shown in FIG. 7A. FIG. 5 is a schematic perspective view showing how the array substrate 20, the driving IC 30, and the flexible printed circuit board 40 are connected in the extended portion 20a. For easy view, the protective layer 43 of the flexible printed circuit board 40, bumps of the driving IC 30, and the connecting lines 26 and 26' provided on the array substrate 20 are not shown in FIG. 5. FIG. 6 is a plan view corresponding to FIG. 5. In FIG. 6, the connecting lines 26 and 26' provided on the array substrate 20 and connected to output bumps of the driving IC 30 are shown, and the protective layer 43 and the bumps of the driving IC 30 are not shown. FIG. 7A is a cross-sectional view taken along line VIIA in FIG. 6, and FIG. 7B is a cross-sectional view taken along line VIIB in FIG. 6. In FIGS. 7A and 7B, the protective layer 43 and the bumps are shown. FIG. 20A is a plan view of a mounting surface of the driving IC 30, showing the layout of the bumps.

As shown in FIG. 20A, a row of (twenty in the embodiment) output bumps 31 and a row of (fourteen in the embodiment) input bumps 32 are provided on a mounting surface 30a of the driving IC 30 close to the array substrate 20. The input bumps 32 include six first input bumps 32a and eight second input bumps 32b. The output bumps 31 are electrically connected to the connecting lines 26 and 26' provided on the array substrate 20 shown in FIG. 6. The first input bumps 32a are electrically connected to the first lines 42a protruding from the base material 41 of the flexible printed circuit board 40 shown in FIG. 6, and the second input bumps 32b are electrically connected to the input lines 25 provided on the array substrate 20 shown in FIG. 6.

As shown in FIGS. 5, 6, and 7A, the first lines 42a of the flexible printed circuit board 40 have the protruding portions 42a' protruding and exposed from the base material 41 and the protective layer 43. The protruding portions 42a' are bonded to the array substrate 20 by an ACF (anisotropic conductive film) 50 serving as a conductive adhesive. Although the adhesive for bonding the flexible printed circuit board 40 to the array substrate 20 at the first lines 42a need not be conductive, the use of the ACF enhances the production efficiency. One-end portions of the first lines 42a are electrically connected to the first input bumps 32a of the driving IC 30 via an ACF 51 serving as a conductive material. That is, since the first lines 42a are longer than the second lines 42b, they are electrically connected to the first input bumps 32a only via the ACF 51, not via the input lines 25 on the array substrate 20. The first lines 42a extend straight on the array substrate 20.

As shown in FIGS. 5, 6, and 7B, one-end portions of the second lines 42b on the flexible printed circuit board 40 are not covered with the protective layer 43, but are exposed. The one-end portions are electrically connected to one-end portions of the input lines 25 on the array substrate 20 via the ACF 50. The other-end portions of the input lines 25 are electrically connected to the second input bumps 32b of the driving IC 30 via the ACF 51.

In the first embodiment, the height of the first input bumps 32a in the driving IC 30 is set to be smaller than that of the second input bumps 32b and the output bumps 31. This is because the bumps are different in the structure of connection with the lines on the base material 41. That is, the second input bumps 32b and the output bumps 31 are connected to the input lines 25 and the connecting lines 26 and 26' on the array substrate 20 via the ACF 50. In contrast, the first input bumps 32a are electrically connected to the first lines 42a on the flexible printed circuit board 40 via the ACF 51, not via the input lines 25 on the array substrate 20. Consequently, the first bumps 32a are different in thickness from the second input bumps 32b and the output bumps 31 by a value obtained by subtracting the thickness of the connecting lines 26 from the sum of the thicknesses of the first lines 42a and the ACF 50. Since the height of the first input bumps 32a is smaller than the height of the second input bumps 32b and the output bumps 31 in this way, electrical connection failure rarely occurs between the first input bumps 32a and the first lines 42a, between the second input bumps 32b and the input lines 25, and between the output bumps 31 and the connecting lines 26. This prevents display failure of the electrooptical device. For example, it is conceivable to make the first input bumps 32a and the second input bumps 32b have the same height, and to provide a thickness-adjusting layer on the array substrate 20 corresponding to the second input bumps 32b. In this case, however, a step of forming the thickness-adjusting layer is added, and production efficiency is thereby decreased. It is also conceivable to make the first input bumps 32a and the second input bumps 32b have the same height, and to press the driving IC 30 when connecting the first input bumps 32a and the first lines 42a, and the second input bumps 32b and the input lines 25 via the ACFs so that the mounting surface 30a of the driving IC 30 is substantially parallel to the surface of the array substrate 20. In this case, however, connection failure sometimes occurs between the second input bumps 32b and the input lines 25. In contrast, in the first embodiment, the first input bumps 32a provided on the driving IC 30 has a height different from the height of the second input bumps 32b and the output bumps 31 in consideration of the difference in the line connecting structure. This increases the production efficiency and prevents display failure due to connection failure in the electrooptical device.

Some (first lines 42a) of the lines provided on the base material 41 are connected to the first input bumps 32a without passing through the input lines 25, and the other lines (second lines 42b) are connected to the second input bumps 32b via the input lines 25. This reduces the number of bumps that should be adjusted in height. That is, the height of the first input bumps 32a is determined in consideration of the difference in the structure of connection with the lines on the base material 41, as described above. Consequently, the number of the first input bumps 32a that should be adjusted in height is made smaller than when none of the lines on the base material 41 are connected to the bumps via the input lines 25, and therefore, adjustment is easy.

For example, a data-line reference clock signal and an enable signal are supplied as high-speed signals to the first lines 42a, as described above. A start signal to the data-line driving circuit 34, a start signal to the scanning-line driving circuit 33, and a clock signal to the scanning-line driving circuit 33 are supplied as low-speed signals to the second lines 42b. One of the second lines 42b is used as a ground line, and a ground signal is supplied thereto.

As described above, the first lines 42a of the flexible printed circuit board 40 are electrically connected to the first input bumps 32a via the ACF 51 without passing through the input lines 25 on the array substrate 20. Therefore, signals are not attenuated by the wiring resistance of the input lines 25. Since attenuation of image signals is minimized, the liquid crystal device 1 having this mounting structure ensures superior display characteristics. Moreover, there is no need to consider the impedance resulting from the lines on the array substrate 20, and therefore, impedance matching in the entire circuit can be easily and reliably performed.

Since high-speed signals are input to the first lines 42a, they can be prevented from attenuation. For example, even when the liquid crystal device has a high resolution, it achieves a good display characteristic. In addition, since the first lines 42a are linear, as described above, they can supply signals, whose attenuation is minimized, to the first input bumps 32a of the driving IC 30.

Since high-speed signals are input to the first lines 42a and low-speed signals are input to the second lines 42b, it is possible to minimize attenuation of the signals and to reduce the size of the mounting structure. Consequently, signals input from the flexible printed circuit board 40 can be prevented from attenuation, the display characteristics of the liquid crystal device 1 are improved, and the size thereof is reduced. The first input bumps 32a and the second input bumps 32b of the driving IC 30 are electrically connected to the first lines 42a and the second lines 42b of the flexible printed circuit board 40, respectively. In general, the pitch between the input bumps of the driving IC is shorter than the pitch between the lines of the flexible printed circuit board. For this reason, for example, when all the lines on the flexible printed circuit board are extended like the first lines 42a, and are electrically connected to the input bumps of the driving IC not via the input lines of the array substrate, but via the ACF, the pitch between the input bumps needs to be long, and this increases the size of the driving IC. Consequently, the sizes of the substrate and the liquid crystal devices are increased. In particular, in a high-resolution liquid crystal device, for example, a large number of outgoing lines are provided. Therefore, it is necessary to increase the area of an extended portion on which the outgoing lines, terminals, and a driving IC are mounted. As a result, the total size of the liquid crystal device increases. In contrast, in the first embodiment, only some (first lines 42a) of the lines on the flexible printed circuit board 40 extend to be electrically connected to the first input bumps 32a without passing through the input lines 25 on the array substrate 20, and the other lines (second lines 42b) are electrically connected to the second input bumps 32b via the input lines 25 as in the related art. Consequently, the input lines 25 electrically connected to the second lines 42b are bent in plan view, and the lines of the flexible printed circuit board 40 can be electrically connected to the input bumps of the driving IC 30 without increasing the size of the driving IC 30 even when the pitch between the input bumps is short. High-speed signals, which are easily attenuated by the wiring resistance of the input lines 25 on the array substrate 20, are input to the first lines 42a of the flexible printed circuit board 40 electrically connected to the first input bumps 32a only via the ACF 51. Therefore, attenuation of signals input to the driving IC 30 is minimized. Furthermore, low-speed signals, which are not easily attenuated by the wiring resistance, are input to the second lines 42b of the flexible printed circuit board 40 electrically connected to the second input bumps 32b via the ACF 50, the input lines 25, and the ACF 51. Even when the input lines 25 electrically connected to the second lines 42b are bent, signal attenuation is not significant. The bending of the input lines 25 can reduce the size of the substrate and the size of the liquid crystal device. Therefore, signal attenuation is minimized, and the size of the mounting structure is reduced. The liquid crystal device 1 having the above-described mounting structure achieves superior display characteristics and a reduced size because signals input from the flexible printed circuit board 40 is prevented from attenuation.

Production Method for Electrooptical Device

A production method for the liquid crystal device of the first embodiment will now be described with reference to FIGS. 8A to 8D.

FIGS. 8A to 8D are explanatory views showing a procedure for producing the liquid crystal device. In each of FIGS. 8A to 8D, a left-side cross-sectional view corresponds to FIG. 7A, and a right-side cross-sectional view corresponds to FIG. 7B.

First, a flexible printed circuit board 40, a liquid crystal panel 2, and a driving IC 30 are prepared.

For example, the flexible printed circuit board 40 can be produced as follows. First, a base material plated with copper is prepared, and lines are formed by patterning copper in a desired shape. Subsequently, the base material is partly removed, for example, by etching so that the lines partly-protrude from the base material. A protective layer is then applied onto the base material having the lines except the protruding portions, thus obtaining the flexible printed circuit board 40.

Figure 8A:
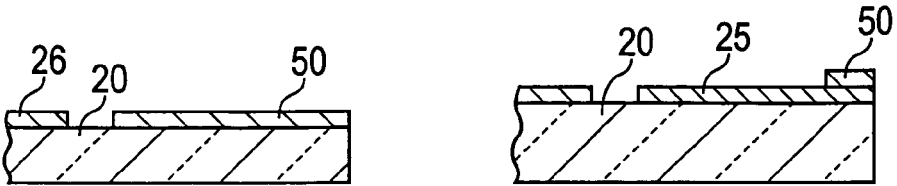
FIGS. 8A to 8D are explanatory views showing a procedure for producing the liquid crystal device.

Next, as shown in FIG. 8A, an ACF 50 serving as a conductive material is applied on a region in which a base material 41 and protruding portions of first lines 42a on the flexible printed circuit board 40, which will be mounted on the liquid crystal panel 2 later, are placed on an extended portion 20a of the liquid crystal panel 2. The ACF 50 is applied on one-end portions of input lines 25 at one end of an array substrate 20. In this case, the ACF 50 applied on the region, in which the first lines 42a of the flexible printed circuit board 40 are bonded later, does not need to be conductive, but is applied-only to increase the bonding strength between the flexible printed circuit board 40 and the liquid crystal panel 2. Therefore, a nonconductive material may be applied on this region, instead of the ACF 50. However, the ACF 50 needs to be applied to electrically connect second lines 42b of the flexible printed circuit board 40 to input lines 25, and therefore, is simultaneously applied at the first lines 42a.

Figure 8B:
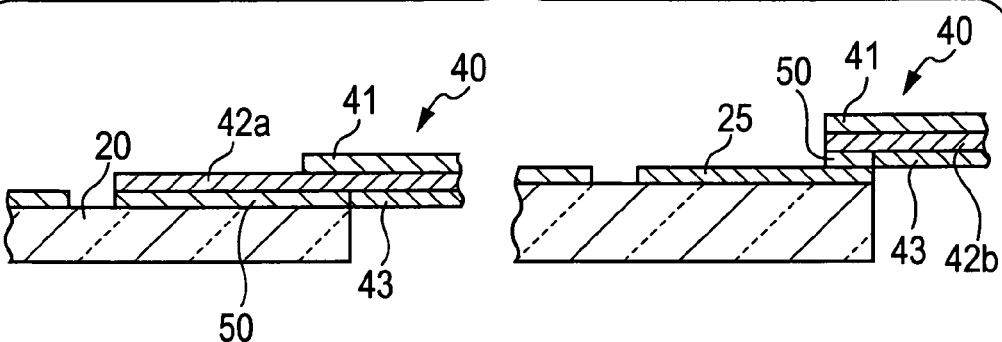

Next, as shown in FIG. 8B, the flexible printed circuit board 40 is placed so that a protective layer 43 opposes the array substrate 20 of the liquid crystal panel 2, and is then bonded to the liquid crystal panel 2. The input lines 25 and the second lines 42b are thereby electrically connected via the ACF 50. The first lines 42a and the protective layer 43 of the flexible printed circuit board 40 are bonded to the array substrate 20 by the ACF 50.

Figure 8C:
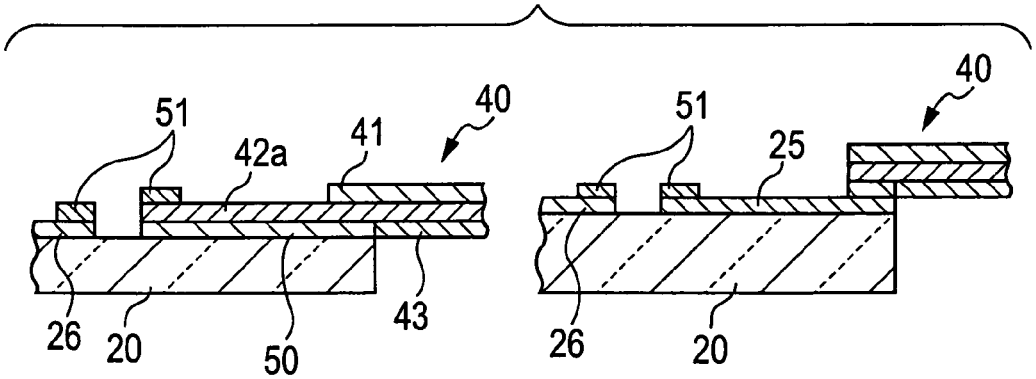

As shown in FIG. 8C, an ACF 51 is then applied on leading ends of the protruding portions of the first lines 42a protruding from the base material 41, the other-end portions of the input lines 25, and one-end portions of connecting lines 26 and 26' connected to output bumps.

Figure 8D:
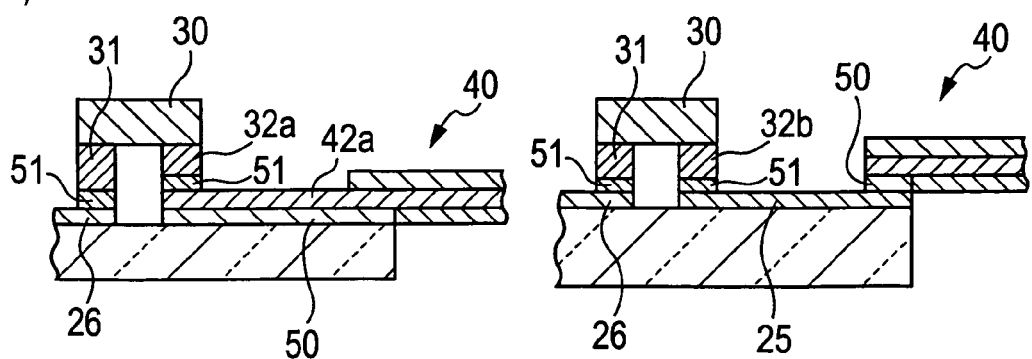

Subsequently, as shown in FIG. 8D, the driving IC 30 is mounted. In the above-described procedure, the first lines 42a are electrically connected to the first input bumps 32a only via the ACF 51 without passing through, for example, the input lines 25 on the array substrate 20. The second lines 42b are electrically connected to the second input bumps 32b via the ACF 50, the input lines 25, and the ACF 51. The output bumps 31 are electrically connected to the connecting lines 26 and 26' via the ACF 51.

After that, the flexible printed circuit board 40 is connected to a circuit board 70, and polarizers 3 are placed on the liquid crystal panel 2, thereby completing the production of the liquid crystal device 1.

Second Embodiment

Configuration of Electrooptical Device

Figure 9:
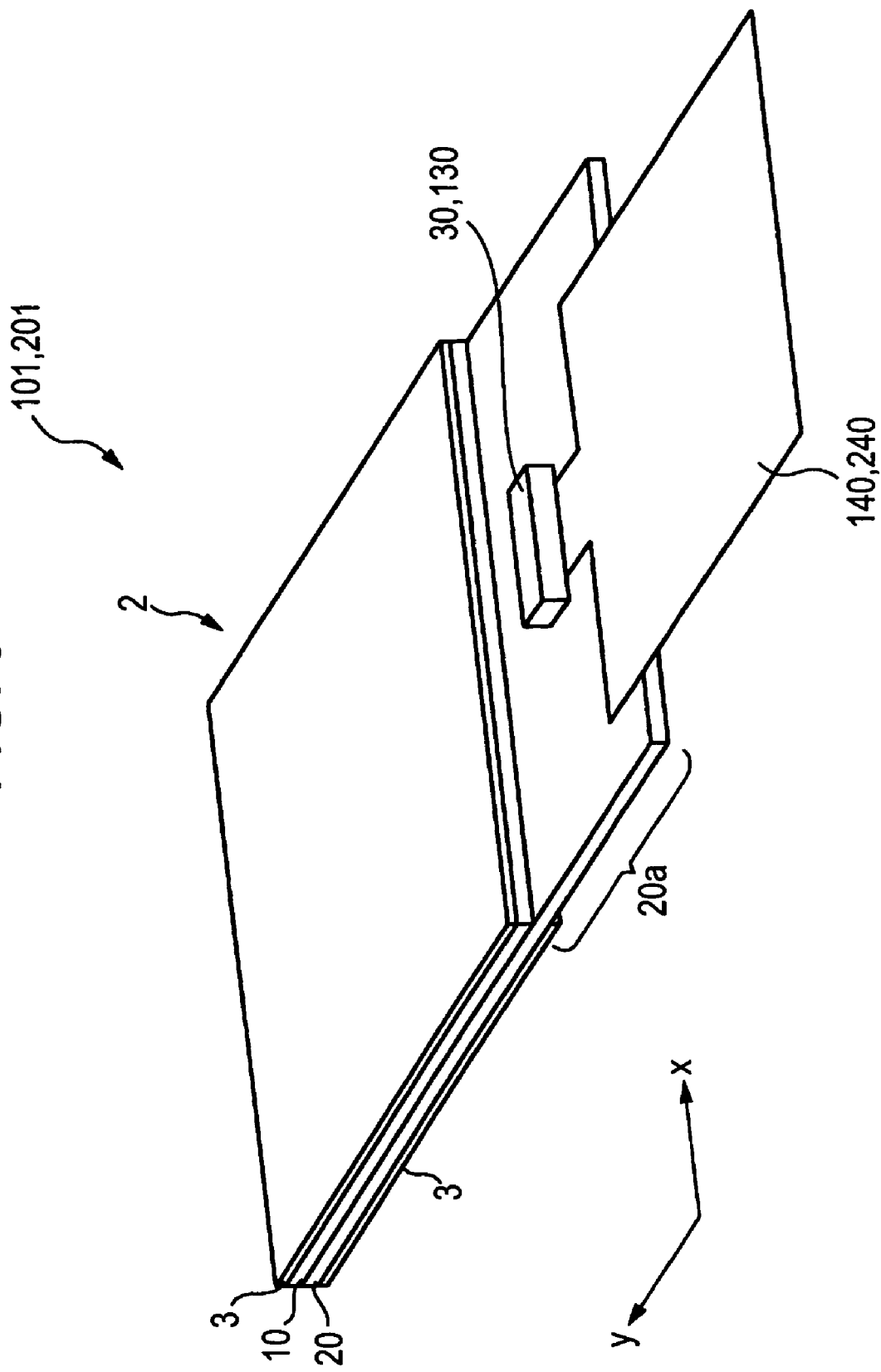
FIG. 9 is a schematic perspective view of a liquid crystal device according to second and third embodiments of the invention.

FIG. 9 is a schematic perspective view of a liquid crystal device serving as an electrooptical device according to a second embodiment of the invention.

The second embodiment is different from the first embodiment only in the shape of the flexible printed circuit board.

The difference will be mainly described below. The same other structures are denoted by the same reference numerals, and descriptions thereof are omitted.

Referring to FIG. 9, a liquid crystal device 101 of the second embodiment includes a liquid crystal panel 2 serving as an electrooptical panel, a pair of polarizers 3 between which the liquid crystal panel 2 is sandwiched, a flexible printed circuit board 140 electrically connected to the liquid crystal panel 2, a driving IC 30 mounted on the liquid crystal panel 2, and a circuit board (not shown) connected to the flexible printed circuit board 140.

Structure of Printed Circuit Board

The flexible printed circuit board 140 will now be described with reference to FIG. 10.

Figure 10:
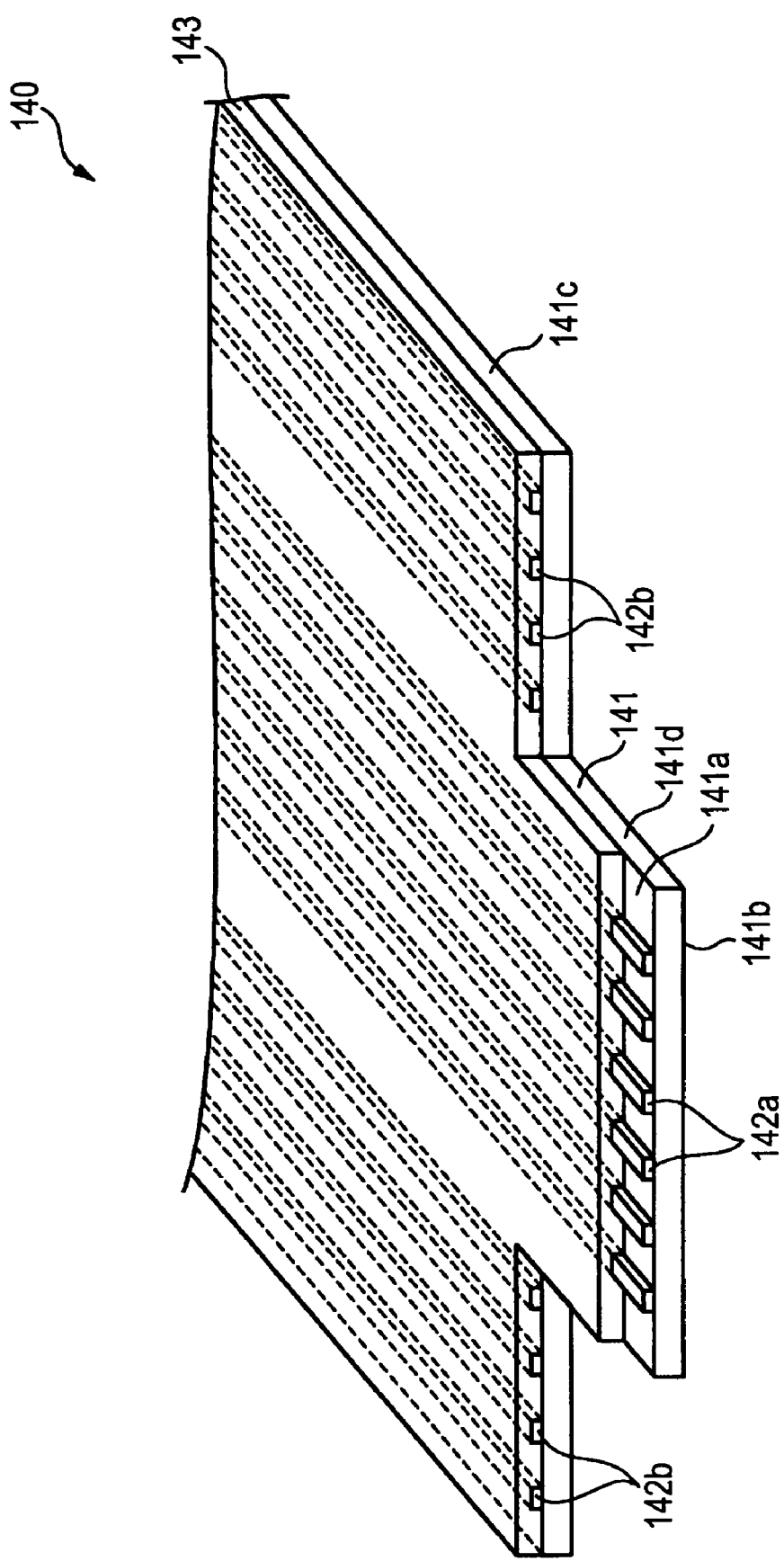
FIG. 10 is a partly enlarged schematic perspective view of a flexible printed circuit board in the liquid crystal device of the second embodiment.

FIG. 10 is a partly enlarged perspective view of the flexible printed circuit board 140 shown in FIG. 9. In FIG. 10, through holes 141e provided in a base material 141 are not shown.

As shown in FIG. 10, the flexible printed circuit board 140 includes a base material 141 made of a flexible material, such as polyimide, and having first and second opposite surfaces 141a and 141b, a plurality of (six in the embodiment) first lines 142a and a plurality of (eight in the embodiment) second lines 142b made of copper and provided on the first surface 141a of the base material 141, and a protective layer 143 made of, for example, polyimide, acryl, or epoxy, and provided on the base material 141 to partly cover the first lines 142a and to completely cover the second lines 142b. As in the first embodiment, the first lines 142a are longer than the second lines 142b, and one-end portions of longer portions thereof are exposed, but are not covered with the protective layer 143. The exposed portions of the first lines 142a are electrically connected to input bumps of the driving IC 30 in the completed liquid crystal device 101. The base material 141 of the flexible printed circuit board 140 overlaps with the driving IC 30 in the completed liquid crystal device 101. While the first lines 42a partly protrude from the base material 41 in the flexible printed circuit board 40 of the first embodiment, the base material 141 in the second embodiment is also provided at the protruding portions of the first lines 142a. Therefore, the first lines 141a are more highly resistant to bending and breaking than in the flexible printed circuit board 40 of the first embodiment, and the mechanical strength of the flexible printed circuit board 140 increases. In the liquid crystal device 101 incorporating this flexible printed circuit board 140, display failure is rarely caused by breaking of the first lines 141a.

The base material 141 has a planar shape defined by a large and rectangular main section 141c and a small rectangular protruding section 141d protruding from one side of the main section 141c. The first and second lines 142a and 142b are arranged substantially parallel to sides orthogonal to the side of the main section 141c from which the protruding section 141d protrudes. The first lines 142 extend on the main section 141c and the protruding section 141d, and the second lines 142b extend only on the main section 141c.

Configuration of Mounting Structure

A mounting structure constituted by the array substrate 20, the driving IC 30 mounted thereon, and the flexible printed circuit board 140 electrically connected to the driving IC 30 will now be described with reference to FIGS. 11 to 13 and 20A.

Figure 11:
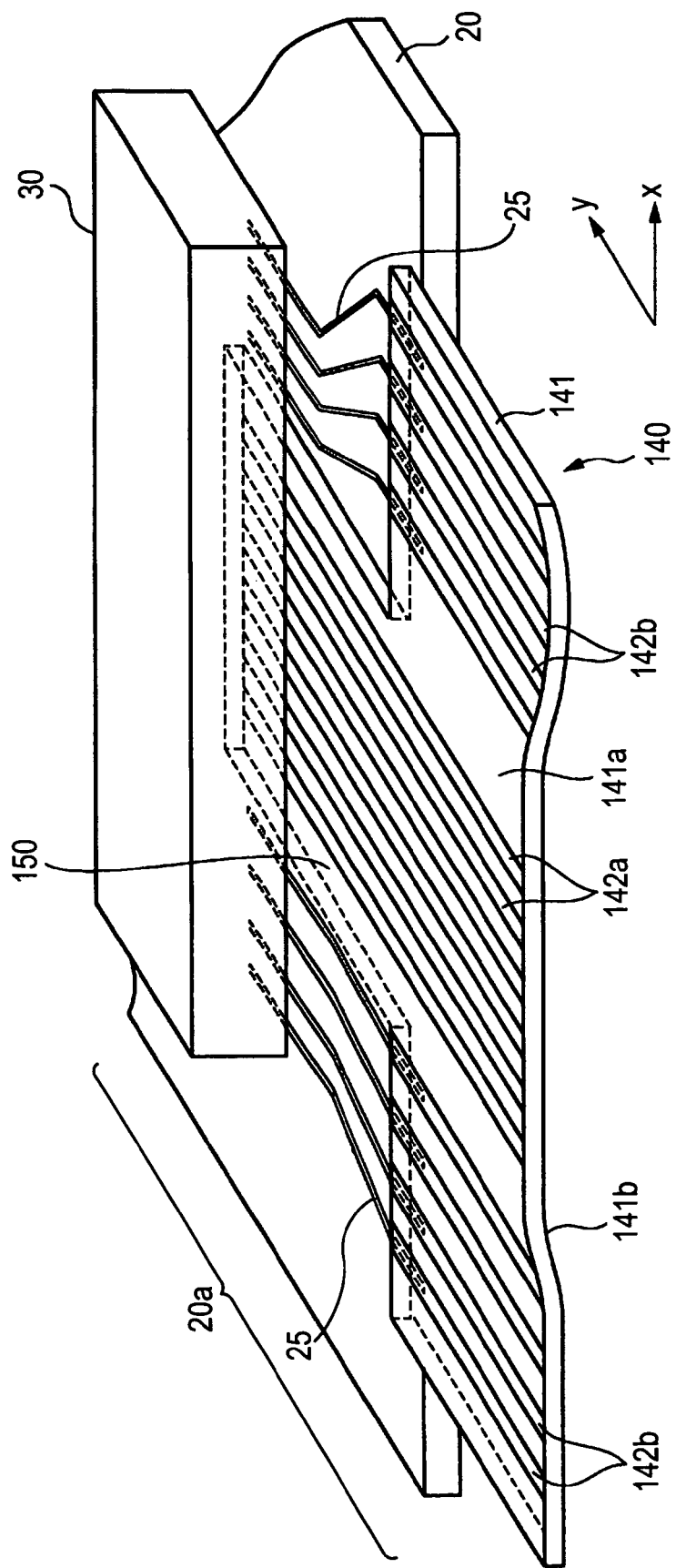
FIG. 11 is a schematic partial sectional view of the liquid crystal device of the second embodiment.
Figure 12:
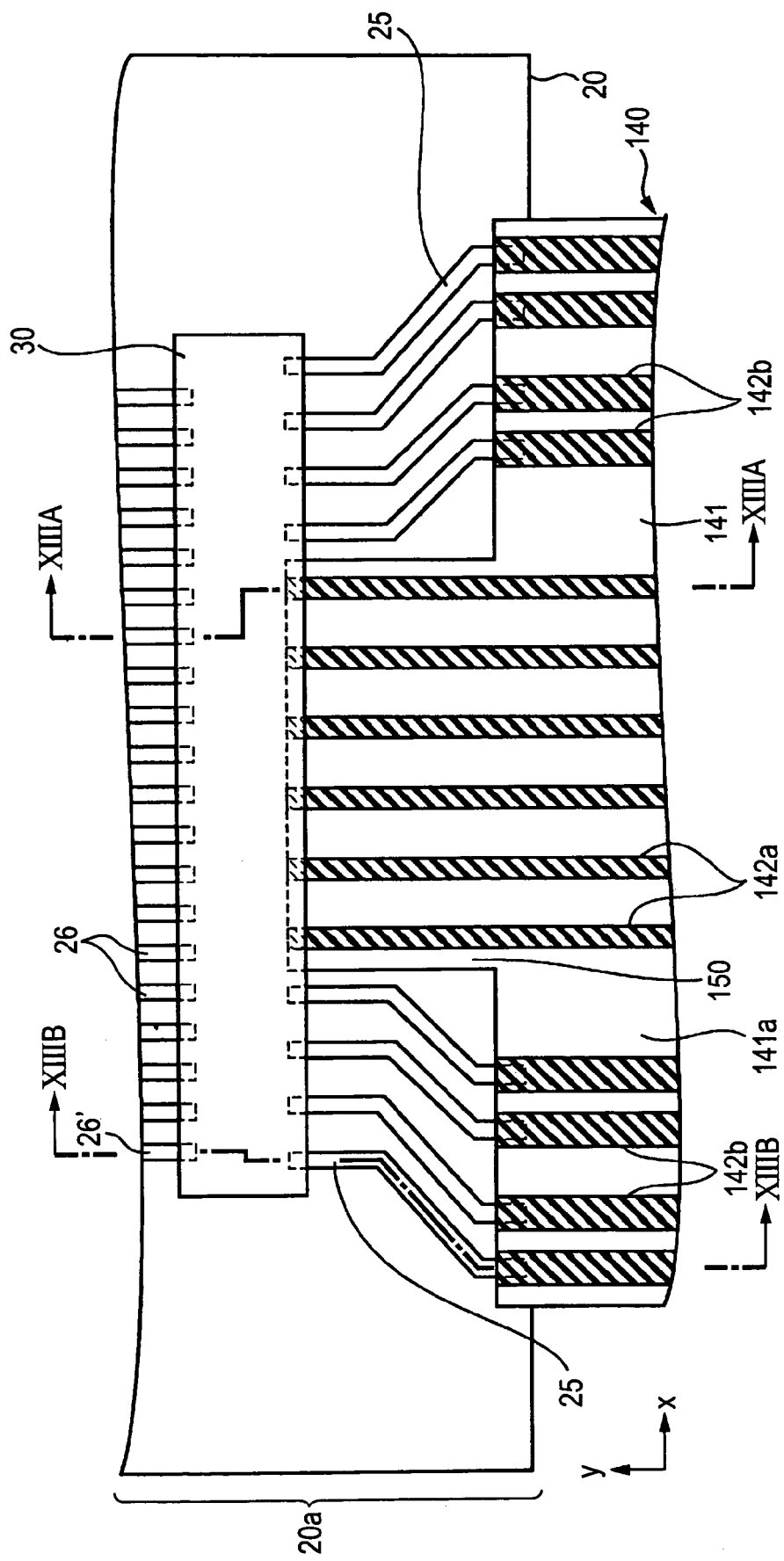
FIG. 12 is a plan view of the liquid crystal device of the second embodiment corresponding to FIG. 11.

FIG. 11 is a schematic perspective view showing how the array substrate 20, the driving IC 30, and the flexible printed circuit board 140 are connected on the extended portion 20a of the liquid crystal device 101. For easy view, the protective layer 143 of the flexible printed circuit board 140, bumps of the driving IC 30, connecting lines 26 and 26' provided on the array substrate 20, and the through holes 141e provided in the base material 141 are not shown in FIG. 11. FIG. 12 is a plan view corresponding to FIG. 11. In FIG. 12, the connecting lines 26 and 26' provided on the array substrate 20 to be connected to output bumps of the driving IC 30 are shown, and the through holes 141e and the protective layer 143 of the base material 141, and the bumps of the driving IC 30 are not shown. FIG. 13A is a cross-sectional view taken along line XIIIA in FIG. 12, and FIG. 13B is a cross-sectional view taken along line XIIIB in FIG. 12. In FIGS. 13A and 13B, the protective layer 143, the through holes 141e, and the bumps of the driving IC 30 are shown. FIG. 20A is a plan view of a mounting surface of the driving IC 30, showing the layout of the bumps.

As shown in FIG. 20A, a row of (twenty in the embodiment) output bumps 31 and a row of (fourteen in the embodiment) input bumps 32 are provided on a mounting surface 30a of the driving IC 30 close to the array substrate 20. The input bumps 32 include six first input bumps 32a and eight second input bumps 32b. The output bumps 31 are electrically connected to the connecting lines 26 and 26' provided on the array substrate 20 shown in FIG. 12. The first input bumps 32a are electrically connected to first lines 142a on the flexible printed circuit board 140 shown in FIG. 12, and the second input bumps 32b are electrically connected to input lines 25 provided on the array substrate 20 shown in FIG. 12.

As shown in FIGS. 11, 12, and 13A, the base material 141 has an overlapping portion 150 that lies on the array substrate 20. The first lines 142a of the flexible printed circuit board 140 are provided on the first surface 141a of the overlapping portion 151 remote from the array substrate 20, and are partly covered with the protective layer 143, and exposed portions thereof are connected to the first input bumps 32a. The base material 141 of the flexible printed circuit board 140 overlaps with the first input bumps 32a of the driving IC 30, and is bonded to the array substrate 20 via an ACF 50 serving as a conductive adhesive. Although the adhesive for bonding the flexible printed circuit board 140 and the array substrate 20 does not need to be conductive at the first lines 142a, the use of the ACF 50 increases the production efficiency, as will be described later. One-end portions of the first lines 142a are electrically connected to the first input bumps 32a of the driving IC 30 by an ACF 51 serving as a conductive material. In the second embodiment, the first lines 142a are also longer than the second lines 142b, and therefore, are electrically connected to the first input bumps 32a only via the ACF 51 without passing through the input lines 25 on the array substrate 20. The first lines 142a extend straight on the array substrate 20.

As shown in FIGS. 11, 12, and 13B, the second lines 142b of the flexible printed circuit board 140 are almost covered with the base material 141 and the protective layer 143. One-end portions of the second lines 142b are electrically connected to one-end portions of the input lines 25 on the array substrate 20 by the ACF 50 via the through holes 141e provided in the base material 141. The other-end portions of the input lines 25 are electrically connected to the second input bumps 32b of the driving IC 30 via the ACF 51.

In the second embodiment, the height of the first input bumps 32a is also set to be smaller than that of the second input bumps 32b and the output bumps 31. This is because the bumps are different in the structure of connection with the lines on the base material 141. That is, the base material 141 is provided and the input lines 25 are not provided in the region in which the first lines 142a are electrically connected to the first input bumps 32a. In contrast, the base material 141 is not provided and the input lines 25 are provided in the region in which the second lines 142b are electrically connected to the input lines 25 and the second input bumps 32b. Accordingly, the heights of the bumps are adjusted in consideration of the difference in connecting structure, in a manner similar to that in the first embodiment. This increases the production efficiency, and prevents display failure due to connection failure in the electrooptical device. The height of the first input bumps 32a is different from the height of the second input bumps 32b and the output bums 31 by a value obtained by subtracting the thickness of the connecting lines 26 from the sum of the thicknesses of the first lines 142a, the ACF 50, and the base material 141.

The base material 141 has the main section 141c and the protruding section 141d. The first lines 142a extend on the main section 141c and the protruding section 141d, and are electrically connected to the first input bumps 32a without passing through the input lines 25. The second lines 142b extend outside the protruding section 141d, and are electrically connected to the second input bumps 32b via the input lines 25. This reduces the number of bumps that should be adjusted in height. That is, the height of the first input bumps 32a is determined in consideration of the difference in the structure of connection with the lines on the base material 141, as described above. Since the number of the first input bumps 32a that should be adjusted in height is made smaller than when all the lines on the base material 141 are connected to the bumps without passing through the input lines 25, adjustment is easy.

As in the first embodiment, a data-line reference clock signal and an enable signal are supplied as high-speed signals to the first lines 142a, and a start signal to a data-line driving circuit, a start signal to a scanning-line driving circuit, a clock signal to the scanning-line driving circuit, and a ground signal are supplied as low-speed signals to the second lines 142b.

As described above, the first lines 142a of the flexible printed circuit board 140 are electrically connected to the first input bumps 32a via the ACF 51 without passing through the input lines 25 on the array substrate 20. Therefore, signals are not attenuated by the wiring resistance of the input lines 25. Consequently, the liquid crystal device 101 having this mounting structure achieves superior display characteristics. Moreover, there is no need to consider the impedance resulting from the wiring on the array substrate 20 for the signals input to the first lines 142a, and therefore, impedance matching in the entire circuit can be easily and reliably performed.

Since high-speed signals are input to the first lines 142a, attenuation thereof is reduced. This improves the display characteristics of the liquid crystal device 101. In addition, since the first lines 142a are linear, as described above, the wiring resistance thereof can be minimized, and as a result, signals can be supplied to the first input bumps 32a of the driving IC 30 with little attenuation.

Since high-speed signals are input to the first lines 142a and low-speed signals are input to the second lines 142b, it is possible to minimize attenuation of the signals and to reduce the size of the mounting structure. This minimization of attenuation of signals input from the flexible printed circuit board 140 improves the display characteristics and reduces the size of the liquid crystal device 101.

Production Method for Electrooptical Device

A production method for the liquid crystal device 101 of the second embodiment will now be described with reference to FIGS. 14A to 14D.

FIGS. 14A to 14D are explanatory views showing a procedure for producing the liquid crystal device 101. In each of FIGS. FIG. 14A to 14D, a left-side cross-sectional view corresponds to FIG. 13A, and a right-side cross-sectional view corresponds to FIG. 13B.

First, a flexible printed circuit board 140, a liquid crystal panel 2, and a driving IC 30 are prepared in a known manner.

Figure 14A:
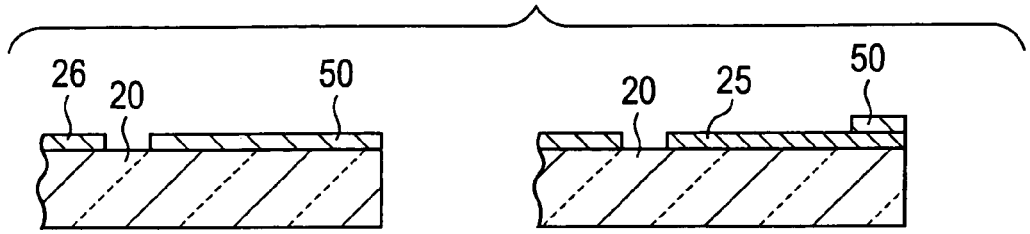
FIGS. 14A to 14D are explanatory views showing a procedure for producing the liquid crystal device of the second embodiment.

Next, as shown in FIG. 14A, an ACF 50 serving as a conductive material is applied on a region in which a base material 141 of the flexible printed circuit board 140, which is bonded to the liquid crystal panel 2 later, is placed on an extended portion 20a of the liquid crystal panel 2. The ACF 50 is applied on one-end portions of input lines 25 at one end of an array substrate 20. In this case, the ACF 50 applied on a region in which first lines 142a of the flexible printed circuit board 140 are bonded later does not need to be conductive, but is applied only to increase the bonding strength between the flexible printed circuit board 140 and the liquid crystal panel 2. Therefore, a nonconductive material may be applied on this region, instead of the ACF 50. However, the ACF 50 needs to be applied to electrically connect second lines 142b of the flexible printed circuit board 140 to input lines 25, and therefore, is simultaneously applied at the first lines 142a.

Figure 14B:
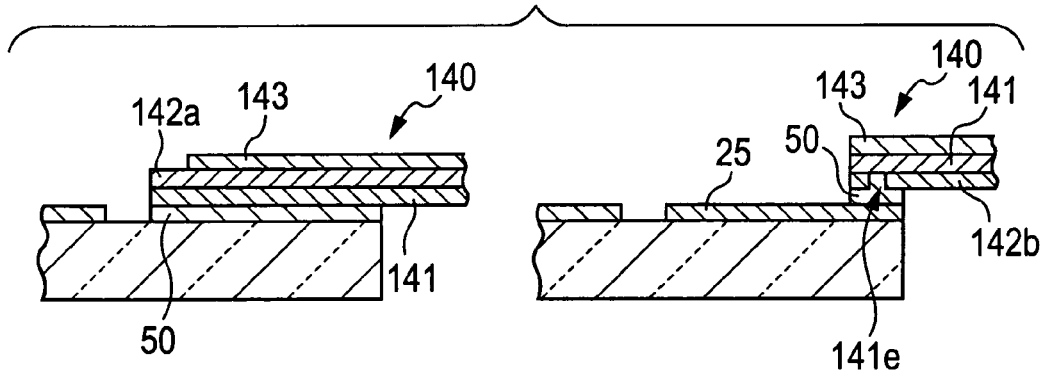

As shown in FIG. 14B, the flexible printed circuit board 140 is placed so that the base material 141 opposes the array substrate 20 of the liquid crystal panel 2, and is then bonded to the liquid crystal panel 2. In this case, the ACF 50 enters through holes 141e provided in the base material 141, and electrically connects the input lines 25 and the second lines 142b. In the region of the flexible printed circuit board 140 including the first lines 142a, the base material 141 and the array substrate 20 are bonded by the ACF 50.

Figure 14C:
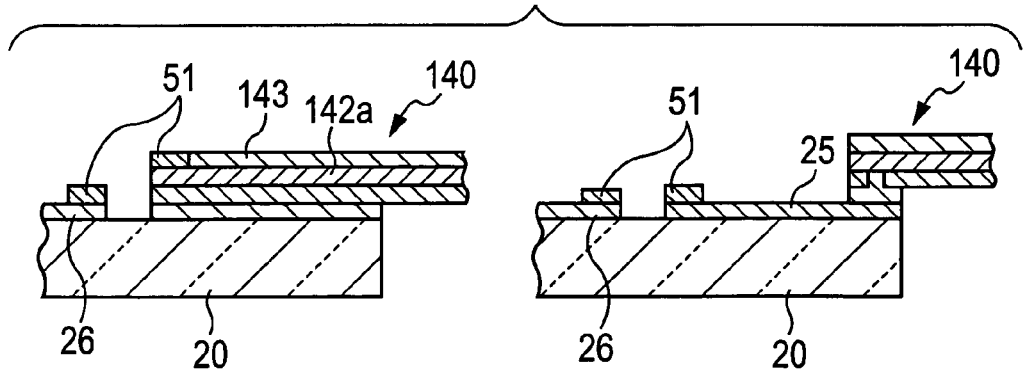

Next, as shown in FIG. 14C, an ACF 51 is applied on leading ends of the first lines 142a, the other-end portions of the input lines 25, and one-end portions of connecting lines 26 and 26' connected to output bumps 31.

Figure 14D:
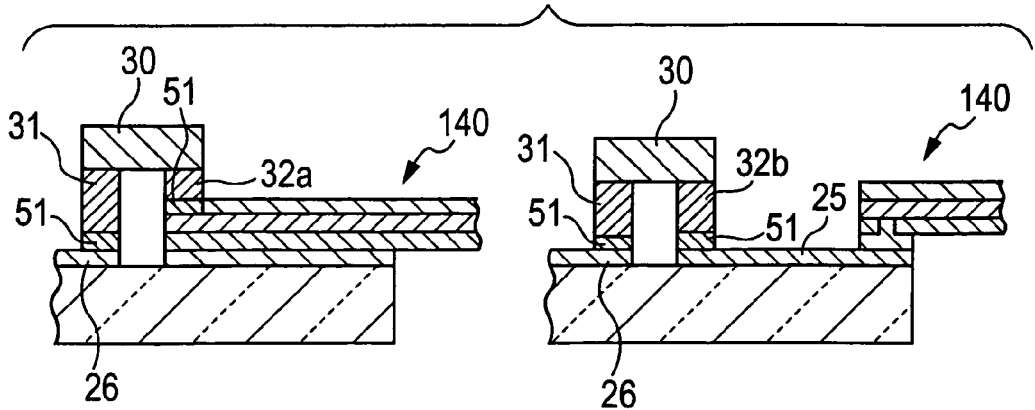

Subsequently, the driving IC 30 is mounted, as shown in FIG. 14D. In the above-described procedure, the first lines 142a are electrically connected to the first input bumps 32a only via the ACF 51 without passing through, for example, the input lines 25 on the array substrate 20. The second lines 142b are electrically connected to the second input bumps 32b via the ACF 50, the input lines 25, and the ACF 51. The output bumps 31 are electrically connected to the connecting lines 26 and 26' via the ACF 51.

After that, the flexible printed circuit board 140 is connected to a circuit board, and polarizers 3 are placed on the liquid crystal panel 2, thus completing the production of the liquid crystal device 101.

Third Embodiment

Configuration of Electrooptical Device

FIG. 9 is a schematic perspective view of a liquid crystal device serving as an electrooptical device according to a third embodiment of the invention.

The third embodiment is different from the first and second embodiments only in the structure of the flexible printed circuit board. The difference will be mainly described below. The same other structures are denoted by the same reference numerals, and descriptions thereof are omitted. Since a flexible printed circuit board in the third embodiment has almost the same outer shape as that of the flexible printed circuit board in the second embodiment, it will be described with reference to FIG. 9 that shows the flexible printed circuit board of the second embodiment.

Referring to FIG. 9, a liquid crystal device 201 of the third embodiment includes a liquid crystal panel 2 serving as an electrooptical panel, a pair of polarizers 3 between which the liquid crystal panel 2 is sandwiched, a flexible printed circuit board 240 electrically connected to the liquid crystal panel 2, a driving IC 30 mounted on the liquid crystal panel 2, and a circuit board (not shown) connected to the flexible printed circuit board 240.

Structure of Printed Circuit Board

The flexible printed circuit board 240 will now be described with reference to FIG. 15.

Figure 15:
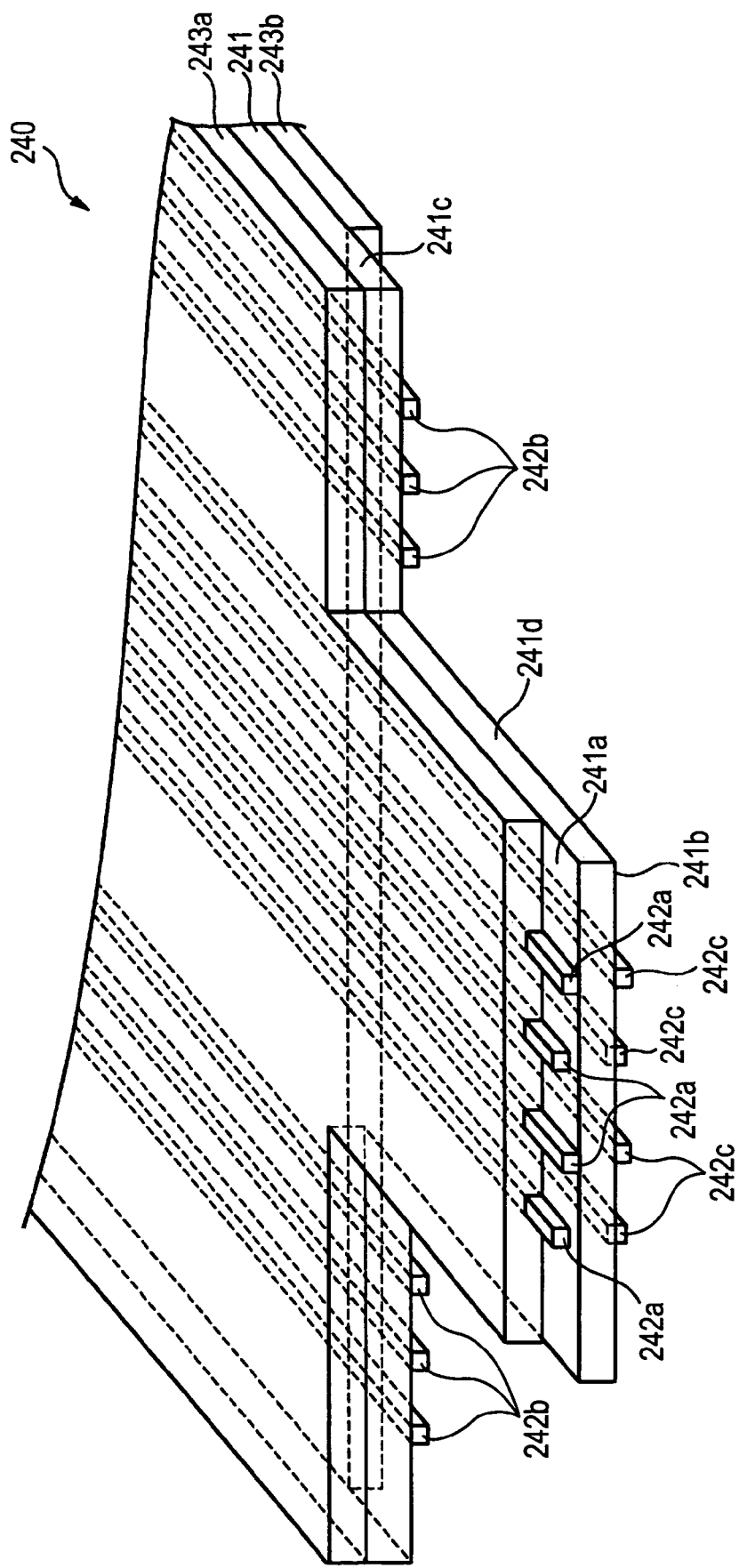
FIG. 15 is a partly enlarged schematic perspective view of a flexible printed circuit board in the third embodiment.

FIG. 15 is a partly enlarged perspective view of the flexible printed circuit board 240 shown in FIG. 9.

While lines are provided only on one side of the base material in the flexible printed circuit board in the first and second embodiments, lines are provided on both sides of the base material in the third embodiment.

As shown in FIG. 15, the flexible printed circuit board 240 includes a base material 241 made of a flexible material such as polyimide, and having first and second opposite surfaces 241*a* and 241*b*, a plurality of (four in the embodiment) first lines 242*a* made of copper and provided on the first surface 241*a*, a plurality of (ten in the embodiment) second lines 242*b* and 242*c* made of copper and provided on the second surface 241*b*, a first protective layer 243*a* made of, for example, polyimide, acryl, or epoxy, and provided to cover a part of the first surface 241*a* including portions of the first lines 242*a*, and a second protective layer 243*b* made of, for example, polyimide, acryl, or epoxy, and provided to cover a part of the second surface 241*b* including portions of the second and third lines 242*b* and 242*c*. One-end portions of the first lines 242 are exposed, but are not covered with the first protective layer 243*a*, and are electrically connected to input bumps of the driving IC 130 in the completed liquid crystal device 201. The base material 241 of the flexible printed circuit board 240 overlaps with the driving IC 130 in the completed liquid crystal device 201. The base material 241 has a planar shape defined by a large and rectangular main section 241*c* and a small rectangular protruding section 241*d* protruding from one side of the main section 241*c*. The first and second lines 242*a*, 242*b*, and 242*c* are arranged substantially parallel to sides of the main section 241*c* orthogonal to the one side from which the protruding section 241*d* protrudes. The first lines 242*a* and the second lines 242*c* extend on the main section 241*c* and the protruding section 241*d*, and the second lines 242*b* extend only on the main section 241*c*. The first lines 242*a* are linear on the protruding section 241*d*. In the flexible printed circuit board 240, the second lines 242*c* almost lie under the first lines 242*a*, and the second lines 242*b* do not lie under the first lines 242*a*. Since the lines are thus provided on both sides of the base material 241, the number of lines can be increased without changing the size of the base material 241.

Configuration of Mounting Structure

A mounting structure constituted by the array substrate 20, the driving IC 130 mounted thereon, and the flexible printed circuit board 240 electrically connected to the driving IC 130 will now be described with reference to FIGS. 16 to 18 and 20B.

Figure 16:
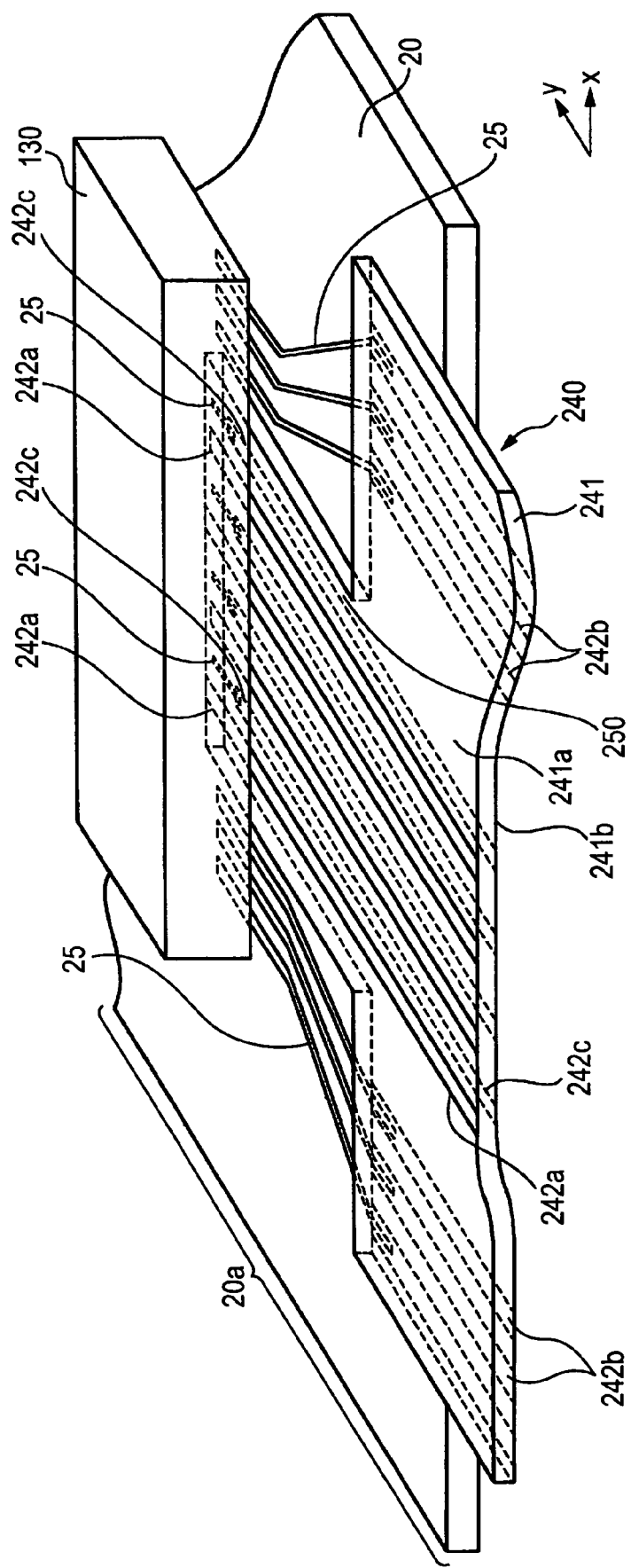
FIG. 16 is a schematic partial perspective view of the liquid crystal device of the third embodiment.
Figure 17:
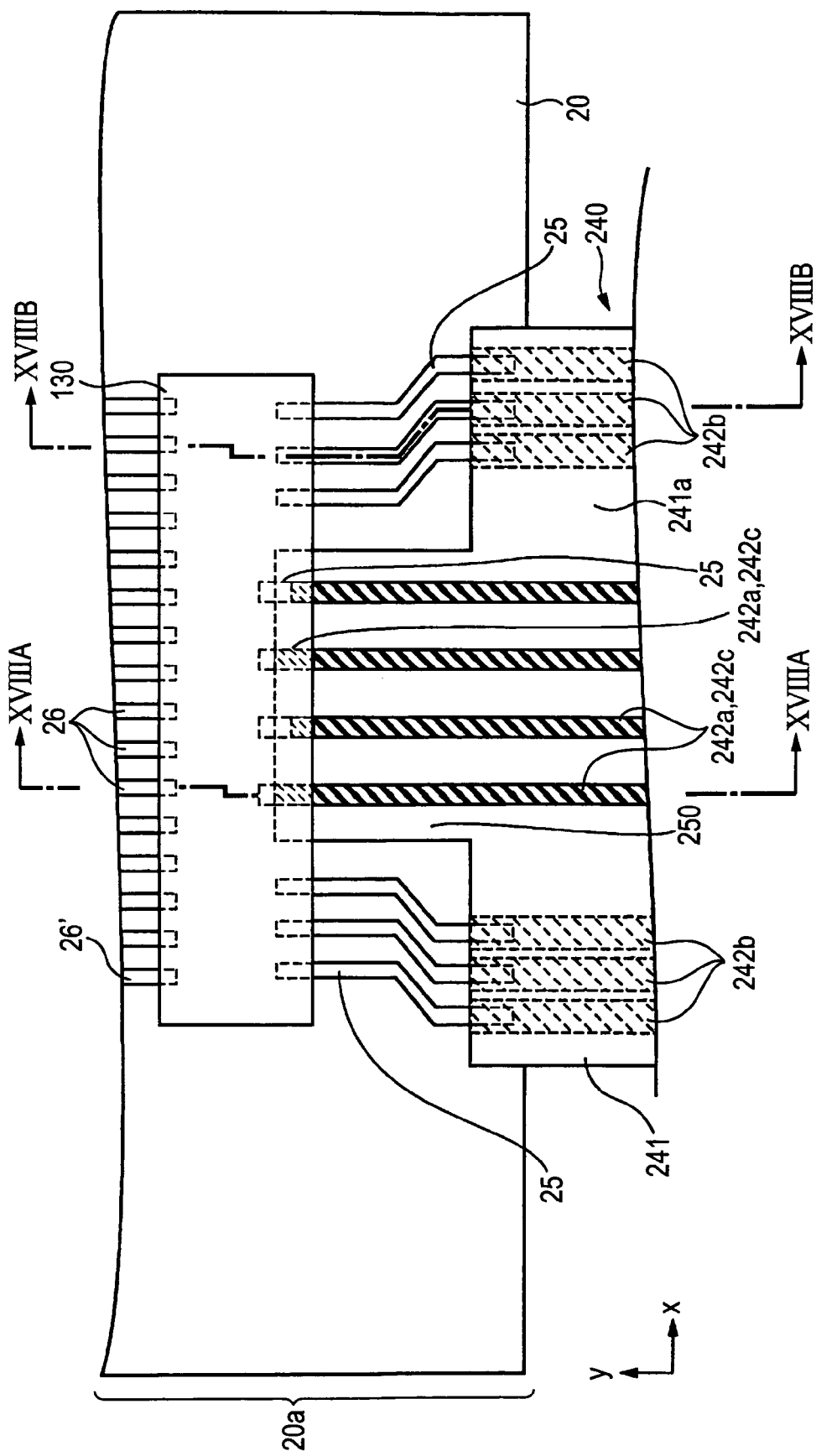
FIG. 17 is a plan view of the liquid crystal device corresponding to FIG. 16.
Figure 18A:
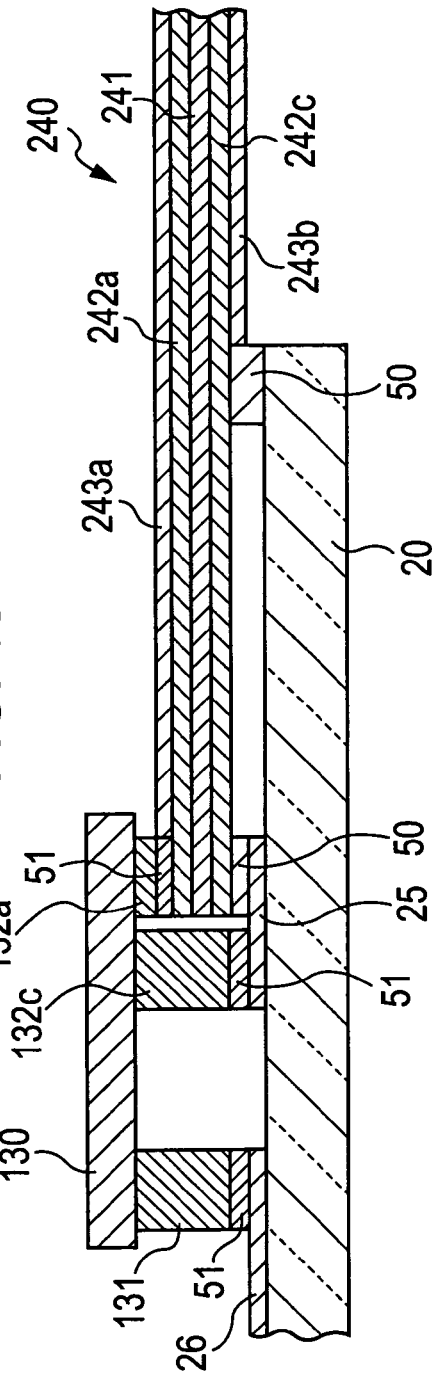
FIGS. 18A and 18B are partial sectional views of the liquid crystal device, respectively, taken along line XVIIIA and XVIIIB in FIG. 17.
Figure 18B:
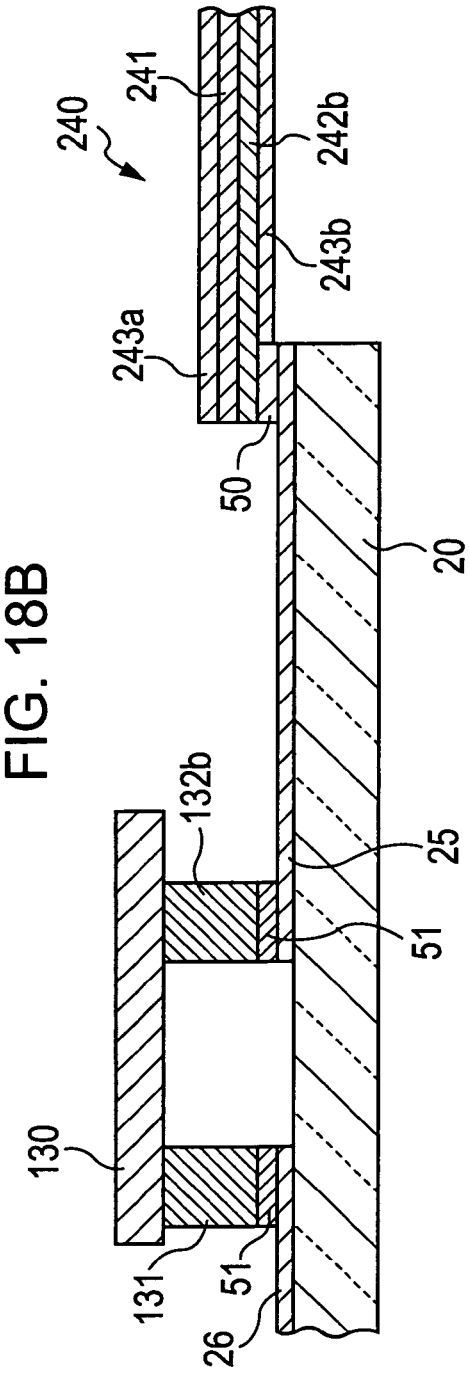

FIG. 16 is a schematic perspective view showing how the array substrate 20, the driving IC 130, and the flexible printed circuit board 240 are connected on an extended portion 20*a* of the liquid crystal device 201. For easy view, the protective layers 243*a* and 243*b* of the flexible printed circuit board 240, bumps of the driving IC 130, and connecting lines 26 and 26' provided on the array substrate 20 to be electrically connected to output bumps of the driving IC 130 are not shown in FIG. 16. FIG. 17 is a plan view corresponding to FIG. 16. In FIG. 17, the connecting lines 26 and 26' are shown, and the protective layers 243*a* and 243*b* and the bumps of the driving IC 130 are not shown. FIG. 18A is a cross-sectional view taken along line XVIIIA in FIG. 17, and FIG. 18B is a cross-sectional view taken along line XVIIIB in FIG. 17. In FIGS. 18A and 18B, the protective layers 243*a* and 243*b* and the bumps of the driving IC 130 are shown. FIG. 20B is a plan view of a mounting surface of the driving IC 130, showing the layout of the bumps.

As shown in FIG. 20B, a plurality of (sixteen in the embodiment) output bumps 131 and a plurality of (fourteen in the embodiment) input bumps 132 are provided on a mounting surface 130*a* of the driving IC 130 close to the array substrate 20. The input bumps 132 include four first input bumps 132*a* and ten second input bumps 132*b* and 132*c*. Three second input bumps 132*b* are provided on each side of the four first input bumps 132*a* and the four second input bumps 132*c*. Since the first input bumps 132*a* and the second input bumps 132*c* are thus arranged in a staggered manner, multiple bumps can be arranged at sufficient intervals. The arrangement manner is not limited to the staggered manner, and, for example, the first input bumps 132*a* and the second input bumps 132*c* may be arranged in two rows.

The second input bumps 132*c* are provided correspondingly to the first input bumps 132*a*, but the second input bumps 132*b* are not provided correspondingly to the first input bumps 132*a*. The output bumps 131 are electrically connected to the connecting lines 26 and 26' provided on the array substrate 20 shown in FIG. 17. The first input bumps 132*a* are electrically connected to the first lines 242*a* on the flexible printed circuit board 240 shown in FIG. 17. The second input bumps 132*b* are electrically connected to input lines 25 provided on the array substrate 20 shown in FIG. 17 and electrically connected to the second lines 242*b*. The second input bumps 132*c* are electrically connected to the input lines 25 electrically connected to the second lines 242*c* provided on the array substrate 20.

As shown in FIGS. 16, 17, and 18A, the base material 241 has an overlapping portion 250 provided on the array substrate 20. The first lines 242*a* of the flexible printed circuit board 240 extend on the first surface 241*a* of the overlapping portion 250 remote from the array substrate 20, and are partly covered with the first protective layer 243*a*. Exposed one-end portions of the first lines 242*a* are electrically connected to the first input bumps 132*a* of the driving IC 130 via an ACF 51 serving as a conductive material. The first lines 242*a* are longer than the second lines 242*b*, and the flexible printed circuit board 240 is placed so that the first lines 242*a* are exposed on the side of the first input bumps 132*a*. Therefore, the first lines 242*a* are electrically connected to the first input bumps 132*a* only via the ACF 51 without passing through the input lines 25 on the array substrate 20. The first lines 242*a* extend straight on the array substrate 20. The second lines 242*c* of the flexible printed circuit board 240 are provided on the second surface 241*b* of the base material 241, and are partly covered with the second protective layer 243*b*. Exposed one-end portions of the second lines 242*c* are electrically connected to one-end portions of the input lines 25 by an ACF 50. The other-end portions of the input lines 25 are electrically connected to the second input bumps 132*c* of the driving IC 130 by the ACF 51. The second lines 242*c* are partly bonded to the array substrate 20 by the ACF 50 serving as a conductive adhesive. Although the adhesive for bonding the second lines 242*c* and the array substrate 20 does not need to be conductive, the use of the ACF 50 increases the production efficiency, as will be described later. The base material 241 overlaps with the first input bumps 132*a* of the driving IC 130.

As shown in FIGS. 16, 17, and 18B, the second lines 242b of the flexible printed circuit board 240 are provided on the second surface 241b of the base material 241, and are partly covered with the second protective layer 243b. Exposed one-end portions of the second lines 242b are electrically connected to one-end portions of the input lines 25 by the ACF 50. The other-end portions of the input lines 25 are electrically connected to the second input bumps 132b of the driving IC 130 by the ACF 51.

The height of the first input bumps 132a is set to be smaller than that of the second input bumps 132b and 132c and the output bumps 31. This is because the bumps are different in the structure of connection with the lines on the base material 241. That is, the first lines 242a, the base material 241, and the second lines 242c are provided in a region in which the first lines 242a are electrically connected to the first input bumps 132a. In contrast, the first lines 242a, the base material 241, and the second lines 242c are not provided in a region in which the input lines 25 electrically connected to the second lines 242b and 242c are connected to the second input bumps 132b and 132c. Accordingly, the heights of the bumps are adjusted in consideration of the difference in the connecting structure, in a manner similar to that in the first embodiment. This increases the production efficiency, and prevents display failure due to connection failure in the electrooptical device. In the third embodiment, the height of the first input bumps 132a is different from the height of the second input bumps 132b. and 132c and the output bums 131 by a value corresponding to the sum of the thicknesses of the first lines 242a, the base material 241, and the second lines 242c.

Some (first lines 242a) of the lines provided on the base material 241 are connected to the first input bumps 132a not via the input lines 25, and the other lines (second lines 242b and 242c) are connected to the second input bumps 132b and 132c via the input lines 25. This reduces the number of bumps that should be adjusted in height. That is, the height of the first input bumps 132a is adjusted in consideration of the difference in the structure of connection with the lines on the base material 241, as described above. The number of the first input bumps 132a that should be adjusted in height is made smaller than when all the lines on the base material 241 are connected to the bumps without passing through the input lines, and therefore, adjustment is easy.

A data-line reference clock signal and an enable signal described above are supplied as high-speed signals to the first lines 242a, and a start signal to a data-line driving circuit, a start signal to a scanning-line driving circuit, a clock signal to the scanning-line driving circuit, and a ground signal are supplied as low-speed signals to the second lines 242b and 242c. One of the second lines 242b and 242c to which a ground signal is input is provided on the second surface 241b of the base material 241. This is effective for impedance matching.

As described above, the first lines 242a of the flexible printed circuit board 240 are electrically connected to the first input bumps 132a via the ACF 51 without passing through the input lines 25 on the array substrate 20. Therefore, signals are not attenuated by the wiring resistance of the input lines 25. Consequently, the liquid crystal device 201 having this mounting structure achieves superior display characteristics. Moreover, there is no need to consider the impedance resulting from the wiring on the array substrate 20 for the signals input to the first lines 242a, and therefore, impedance matching in the entire circuit can be easily and reliably performed. In addition, since the input lines 25 electrically connected to the second lines 242c are shorter than the input lines 25 electrically connected to the second lines 242b, they are less susceptible to the wiring resistance on the array substrate 20. This reduces signal attenuation.

Since high-speed signals are input to the first lines 242a, attenuation thereof is reduced, and the display characteristics of the liquid crystal device 201 are improved. In addition, since the first lines 242a are linear, as described above, the wiring resistance thereof can be minimized. As a result, signals can be supplied to the first input bumps 132a of the driving IC 130 with little attenuation.

Since high-speed signals are input to the first lines 242a and low-speed signals are input to the second lines 242b, as in the first embodiment, it is possible to minimize attenuation of the signals and to reduce the size of the mounting structure. Attenuation of signals input from the flexible printed circuit board 240 is reduced, and therefore, the display characteristics of the liquid crystal device 201 are improved, and the size thereof is decreased.

Production Method for Electrooptical Device

A production method for the liquid crystal device 201 of the third embodiment will now be described with reference to FIGS. 19A to 19D.

FIGS. 19A to 19D are explanatory views showing a procedure for producing the liquid crystal device 201. In each of FIGS. 19A to 19D, a left-side cross-sectional view corresponds to FIG. 18A, and a right-side cross-sectional view corresponds to FIG. 18B.

First, a flexible printed circuit board 240, a liquid crystal panel 2, and a driving IC 130 are prepared in a known manner.

Figure 19A:
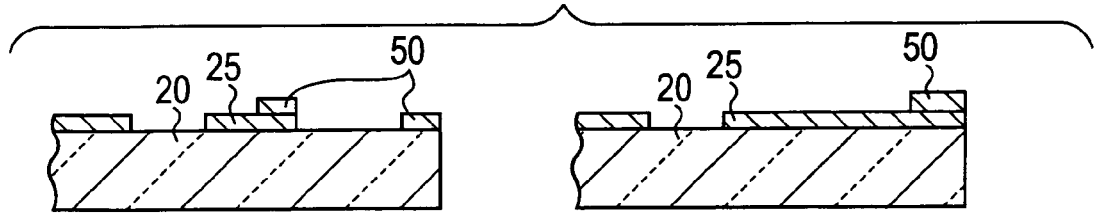
FIGS. 19A to 19D are explanatory views showing a procedure for producing the liquid crystal device of the third embodiment.

Next, as shown in FIG. 19A, an ACF 50 serving as a conductive material is applied on a region in which the flexible printed circuit board 240, which is bonded to the liquid crystal panel 2 later, is placed on an extended portion 20a of the liquid crystal panel 2. The ACF 50 is applied on one-end portions of input lines 25 at one end of an array substrate 20, and on one-end portions of second lines 242b different from the other-end portions electrically connected to the input lines 25 on the array substrate 20.

Figure 19B:
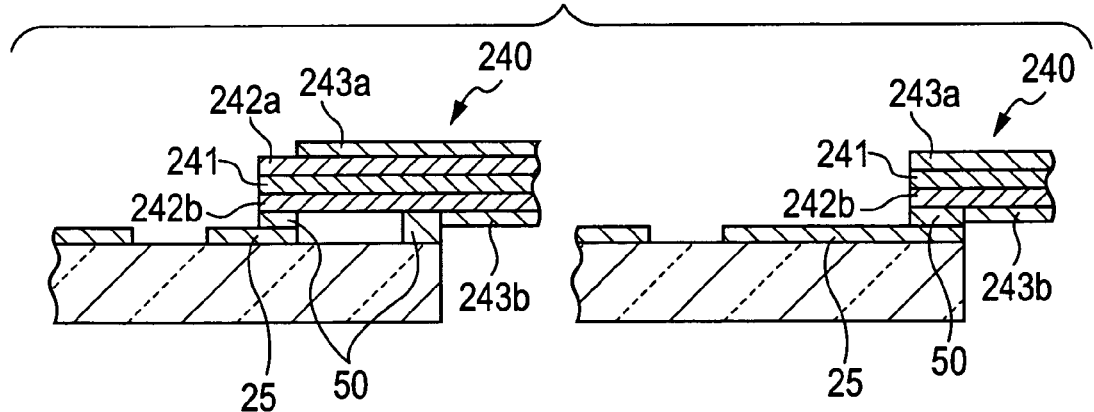

As shown in FIG. 19B, the flexible printed circuit board 240 is placed so that a second protective layer 243b opposes the array substrate 20 of the liquid crystal panel 2, and is then bonded to the liquid crystal panel 2. In this case, the second lines 242b and 242c are electrically connected to the input lines 25 via the ACF 50.

Figure 19C:
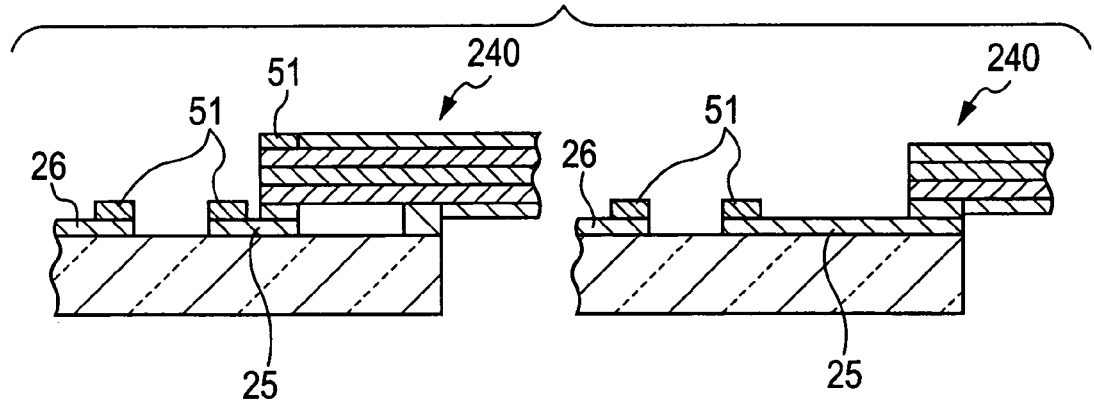

Next, as shown in FIG. 19C, an ACF 51 is applied on leading ends of the first lines 242a, the other-end portions of the input lines 25, and one-end portions of connecting lines 26 and 26' connected to output bumps 31.

Figure 19D:
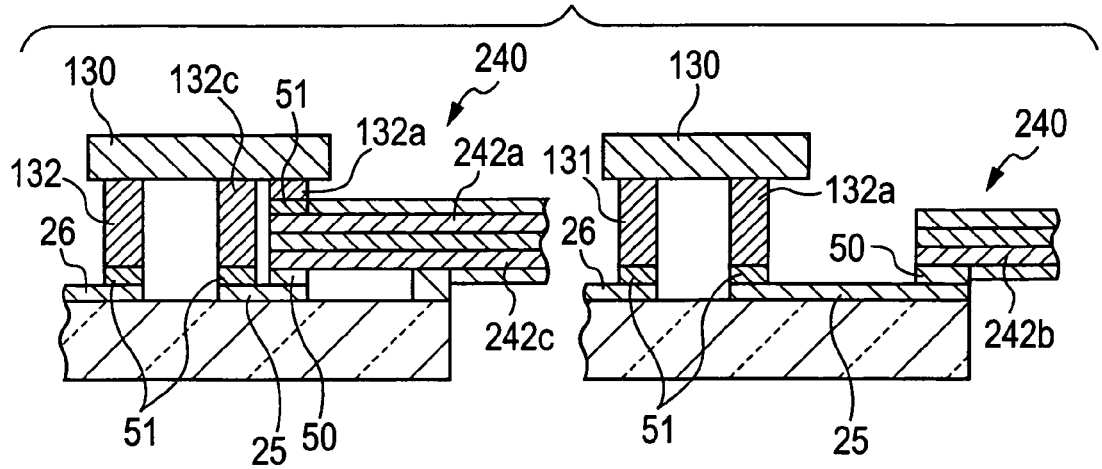

After that, the driving IC 30 is mounted, as shown in FIG. 19D. In the above-described procedure, the first lines 242a are electrically connected to first input bumps 132a only via the ACF 51 without passing through the input lines 25 on the array substrate 20. The second lines 242b are electrically connected to second input bumps 132b via the ACF 50, the input lines 25, and the ACF 51. The second lines 242c are electrically connected to second input bumps 132c via the ACF 50, the input lines 25, and the ACF 51. The output bumps 31 are electrically connected to the connecting lines 26 and 26' via the ACF 51.

Subsequently, the flexible printed circuit board 240 is connected to a circuit board, and polarizers 3 are placed on the liquid crystal panel 2, thereby completing the production of the liquid crystal device 201.

Figure 21:
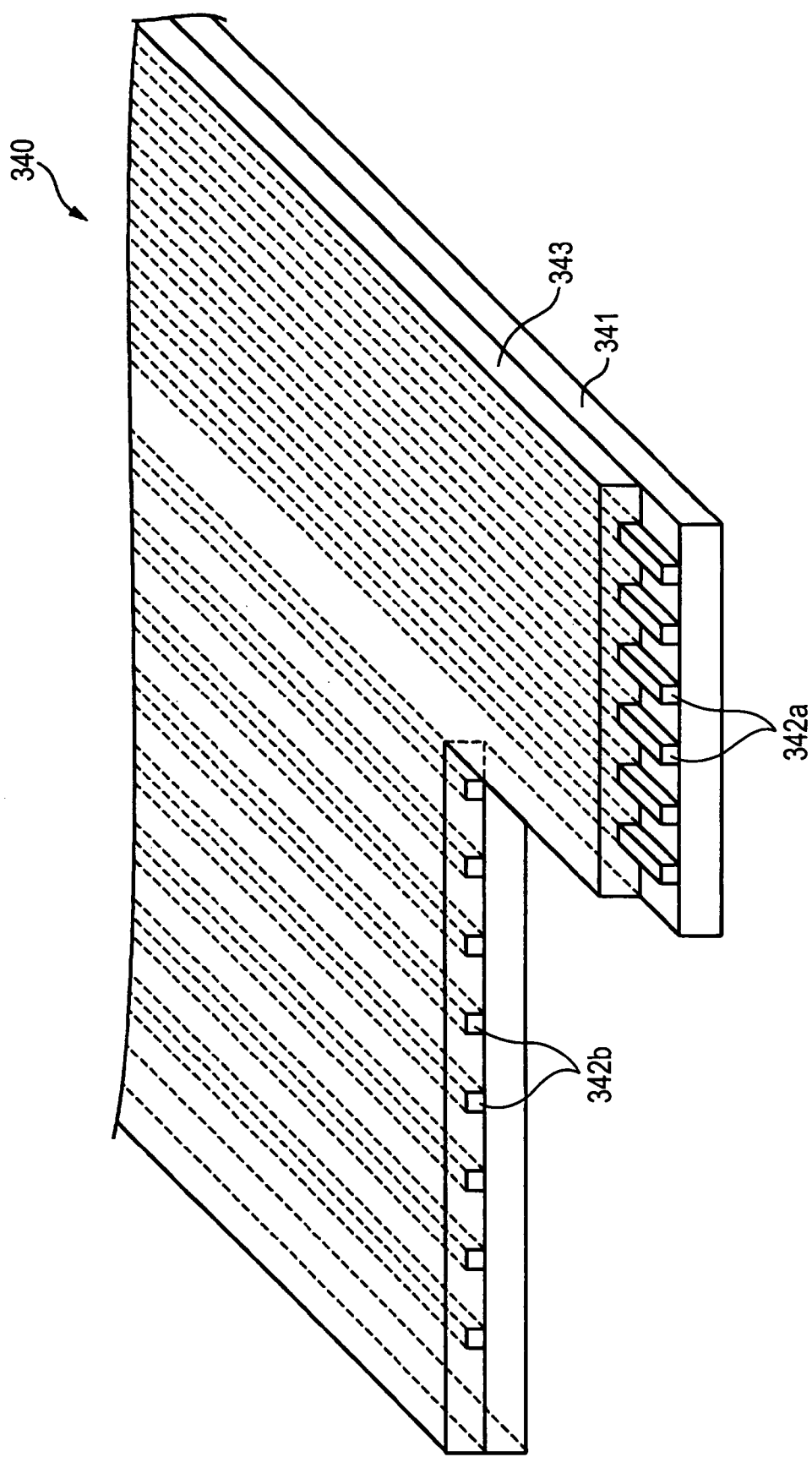
FIG. 21 is a partly enlarged schematic perspective view of a modification of a flexible printed circuit board.

While the second lines are provided on both sides of the group of first lines in plan view on the flexible printed circuit board in the above embodiments, for example, they may be provided on one side of the group of first lines, as shown in FIG. 21.

FIG. 21 is a perspective view showing a modification of the flexible printed circuit board of the second embodiment. Similarly, the arrangement of the first and second lines may be changed in the flexible printed circuit boards of the first and third embodiments. In FIG. 21, through holes provided in a base material 341 are not shown.

As shown in FIG. 21, a flexible printed circuit board 340 includes a flexible base material 341 made of, for example, polyimide, a plurality of (six in this modification) first lines 342*a* and a plurality of (eight in this modification) second lines 342*b* made of copper and provided on one surface of the base material 341, and a protective layer 343 provided on the base material 341 to partly cover the first lines 342 and to completely cover the second lines 342*b*. The second lines 342*b* are provided on one side of the first lines 342*a*. The first lines 342*a* are longer than the second lines 342*b*, and the longer portions thereof are not covered with the protective layer 343, but are exposed. The base material 341 has a planar shape defined by a large rectangular section, and a small rectangular section protruding from one side of the large rectangular section, and one end of the large rectangular section is aligned with one end of the small rectangular section. The first lines 342*a* and the second lines 342*b* extend substantially parallel to a side of the large rectangular section orthogonal to the side from which the small rectangular section protrudes. The longer portions of the first lines 342*a* are provided on the small rectangular section.

Fourth Embodiment

Electronic Apparatus

A description will now be given of an electronic apparatus provided with the above-described liquid crystal device 1 (101, 201).

Figure 22:
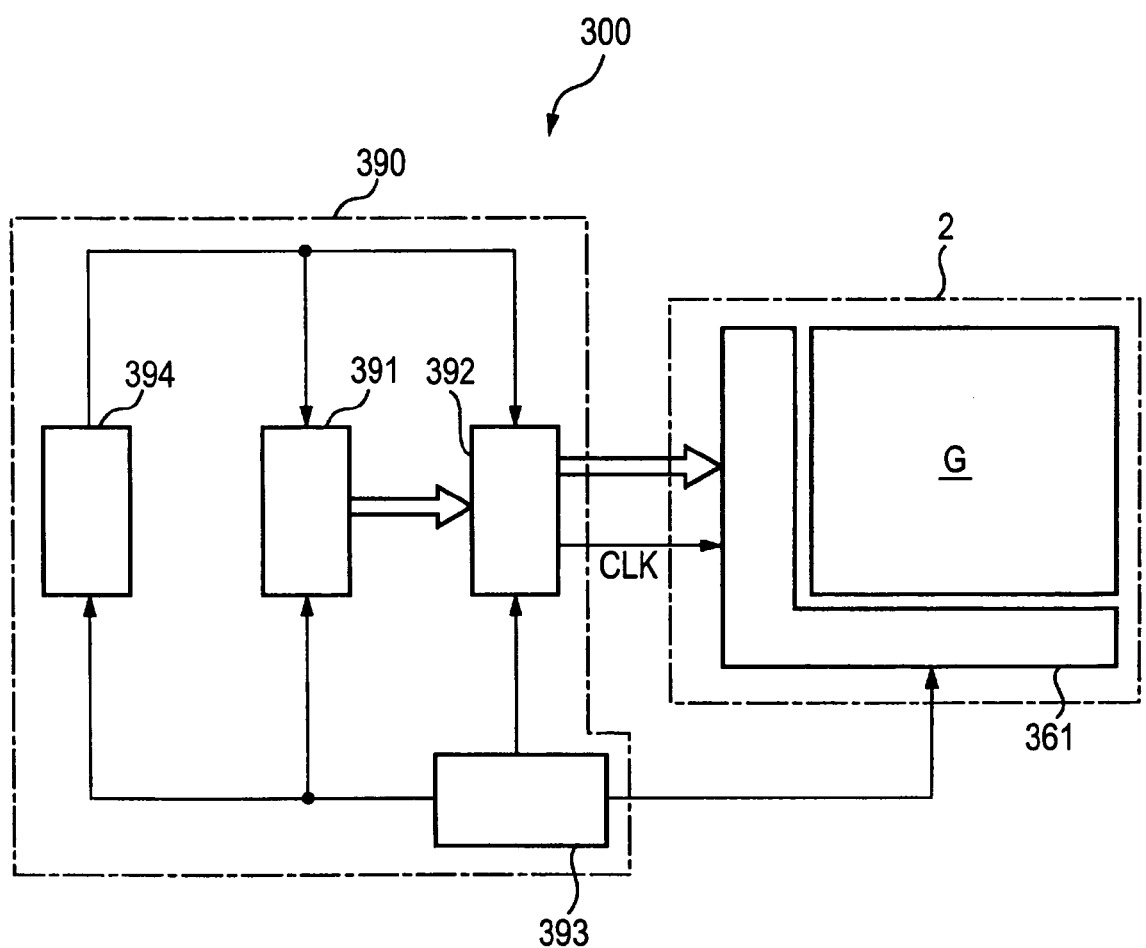
FIG. 22 is a schematic view showing the overall configuration of a display control system of an electronic apparatus according to a fourth embodiment of the invention.

FIG. 22 is a schematic view showing the overall configuration of a display control system in an electronic apparatus according to a fourth embodiment of the invention.

An electronic apparatus 300 of the fourth embodiment includes, for example, a liquid crystal panel 2 and a display control circuit 390 as a display control system, as shown in FIG. 22. The display control circuit 390 includes a display information output source 391, a display information processing circuit 392, a power circuit 393, and a timing generator 394.

The liquid crystal panel 2 has a driving circuit 361 for driving a display region G.

The driving circuit 361 corresponds to the driving IC 30 in the above-described liquid crystal device 1, and the control circuit 390 corresponds to the circuit board 70.

The display information output source 391 includes memories such as a ROM (read only memory) and a RAM (random access memory), a storage unit such as a magnetic recording disc and an optical recording disc, and a tuning circuit for outputting tuned digital image signals. The display information output source 391 supplies display information in a predetermined image signal format to the display information processing circuit 392 according to various clock signals generated by the timing generator 394.

The display information processing circuit 392 includes various known circuits such as a serial-parallel conversion circuit, an amplifying and inverting circuit, a rotation circuit, a gamma-correction circuit, and a clamping circuit. The display information processing circuit 392 processes input display information, and supplies the information together with a clock signal CLK to the driving circuit 361. The driving circuit 361 includes a scanning-line driving circuit, a data-line driving circuit, and an inspection circuit. The power circuit 393 supplies predetermined voltages to the above components.

In the electronic apparatus 300 having the above configuration, attenuation of signals is minimized, and therefore, high-quality display is ensured.

Specific examples of electronic apparatuses are mobile telephones, personal computers, touch panels having a liquid crystal device, projectors, liquid crystal televisions, viewfinder and direct-monitor-view video tape recorders, car navigation systems, pagers, electronic notebooks, electronic desk calculators, word processors, workstations, videophones, and POS terminals. The above-described liquid crystal device 1 (101, 201) can be applied as a display section to these electronic apparatuses.

The mounting structure, electrooptical device, and electronic apparatus of the invention are not limited to the above-described embodiments, and various modifications are possible without departing from the scope of the invention.

For example, while the liquid crystal panel serving as an electrooptical panel and the flexible printed circuit board are connected in the above-described mounting structure, the invention is also applicable to a case in which an intermediate substrate is provided to connect the electrooptical panel and the flexible printed circuit board. In this case, the intermediate substrate or the flexible printed circuit board corresponds to the base material of the invention on which the first and second lines are provided. The invention is also applicable not only to the connection between the electrooptical panel and the printed circuit board, but also to the connection between two substrates other than the electrooptical panel. While the above-described electrooptical devices are liquid crystal devices having a liquid crystal panel, the invention can be applied to various other electrooptical devices, for example, an organic or inorganic electroluminescence device, a plasma display device, an electrophoretic display device, and a device utilizing an electron emitter (a field emission display or a surface-conductive electron-emitter display).

While the above-described liquid crystal device is an active-matrix liquid crystal device that uses TFTs as switching elements, the invention is also applicable to liquid crystal devices utilizing other switching elements, for example, an active-matrix liquid crystal device utilizing thin-film diodes.

In the above embodiments, some (first lines) of the lines provided on the base material, to which high-speed signals are input, are electrically connected to the input bumps without passing through the input lines on the substrate, and the other lines (second lines) are electrically connected to the input bumps via the input lines. In this way, preferably, only the lines to which high-speed signals are input are electrically connected to the input bumps without passing through the input lines. However, if possible, all the lines provided on the base material may be electrically connected to the input bumps without passing through the input lines. In particular, the structure in which the lines are provided on both sides of the base material, as in the third embodiment, is suited to connecting all the lines without passing through the input lines on the substrate.

What is claimed is:

1. An electrooptical device comprising:
   a substrate having a first substrate wiring line and a second substrate wiring line formed on a first surface of the substrate;

a semiconductor device mounted on the first surface of the substrate and overlapping the first and second substrate wiring lines, the semiconductor device including:
  a first input bump and a second input bump provided on a side of the semiconductor device that is mounted to the first surface of the substrate, and
  an output bump provided on the side of the semiconductor device, the second input bump being connected to the second substrate wiring line, the output bump being disposed on and connected to the first substrate wiring line;
a base material overlapping the first surface of the substrate, the base material having a second surface facing the first surface, the second surface having an overlapping portion disposed on the first surface and a non-overlapping portion extending away from an end of the substrate;
a first wiring line formed on the second surface of the base material on the overlapping and non-overlapping portions, the first wiring line protruding from the base material and extending continuously from the base material, over the first surface of the substrate, and to directly under the first input bump, the first wiring line being electrically and mechanically connected to the first input bump through only a single anisotropic conductive film; and
a second wiring line formed on the overlapping and non-overlapping portions of the second surface of the base material, the second wiring line being electrically connected to the second input bump via the second substrate wiring line and two separate anisotropic conductive films.

2. The electrooptical device according to claim 1, wherein a high-speed signal is input to the first wiring line, the high speed signal having a first frequency greater than or equal to 50 MHz.

3. The electro-optical device according to claim 2, wherein a low-speed signal is input to the second wiring line, the low-speed signal having a second frequency lower than the first frequency of the high-speed signal.

4. The electrooptical device according to claim 1, wherein the first wiring line is linear at least at a portion of the first wiring line that overlaps the substrate.

5. The electrooptical device according to claim 1, wherein a ground signal is input to the second wiring line.

* * * * *